United States Patent
Jung et al.

(10) Patent No.: US 11,778,801 B2
(45) Date of Patent: Oct. 3, 2023

(54) SEMICONDUCTOR DEVICE HAVING A NODE CAPPING PATTERN AND A GATE CAPPING PATTERN

(71) Applicant: Samsung Electronics Co., Ltd., Suwon-si (KR)

(72) Inventors: Sung Hun Jung, Suwon-si (KR); Heon Jong Shin, Yongin-si (KR); Min Chan Gwak, Hwaseong-si (KR); Sung Moon Lee, Suwon-si (KR); Jeong Ki Hwang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 219 days.

(21) Appl. No.: 17/185,102

(22) Filed: Feb. 25, 2021

(65) Prior Publication Data
US 2022/0020753 A1    Jan. 20, 2022

(30) Foreign Application Priority Data

Jul. 15, 2020 (KR) .................. 10-2020-0087200

(51) Int. Cl.
*H10B 10/00* (2023.01)
*H01L 23/528* (2006.01)
*H01L 21/768* (2006.01)

(52) U.S. Cl.
CPC ....... *H10B 10/12* (2023.02); *H01L 21/76802* (2013.01); *H01L 21/76883* (2013.01); *H01L 23/528* (2013.01); *H10B 10/125* (2023.02)

(58) Field of Classification Search
CPC ...... H10B 10/12; H10B 10/125; H10B 99/00; H01L 21/76802; H01L 21/76883; H01L 23/528; H01L 29/42392; H01L 29/78696; H01L 21/76834; H01L 21/76895; H01L 21/76897; H01L 23/485; H01L 23/5283; H01L 27/0924; H01L 27/0207; H01L 21/823871; H01L 21/823807;
(Continued)

(56) References Cited

U.S. PATENT DOCUMENTS 8,264,022 B2    9/2012  Yoon et al.
8,765,599 B2    7/2014  Yuan et al.
(Continued)

FOREIGN PATENT DOCUMENTS

KR    2019-0049166 A    5/2019

*Primary Examiner* — Duy T Nguyen
(74) *Attorney, Agent, or Firm* — Harness, Dickey & Pierce, P.L.C.

(57) ABSTRACT

A semiconductor device comprises a first gate structure extending in a first direction and including a first gate electrode and a first gate capping pattern, a second gate structure spaced apart from the first gate structure and extending in the first direction, and including a second gate electrode and a second gate capping pattern, an active pattern extending in a second direction, the active pattern below the second gate structure, an epitaxial pattern on one side of the second gate structure and on the active pattern, a gate contact connected to the first gate electrode, and a node contact connected to the second gate electrode and to the epitaxial pattern. An upper surface of the gate contact is at a same level as the first gate capping pattern, and an upper surface of the node contact is lower than the upper surface of the first gate capping pattern.

20 Claims, 40 Drawing Sheets

(58) Field of Classification Search
CPC ..... H01L 21/823814; H01L 21/823821; H01L 21/823878; H01L 27/092; H01L 29/0673; H01L 29/66795; H01L 29/78
USPC .......................................................... 257/393
See application file for complete search history.

(56) References Cited

U.S. PATENT DOCUMENTS

| | | | |
|---|---|---|---|
| 9,202,775 | B2 | 12/2015 | Jung et al. |
| 9,502,528 | B2* | 11/2016 | Bouche ............. H01L 29/41783 |
| 9,917,050 | B2* | 3/2018 | Chen ................. H01L 29/42364 |
| 10,177,241 | B2* | 1/2019 | Park .................. H01L 29/41791 |
| 2017/0148727 | A1* | 5/2017 | Do ....................... H01L 23/5221 |
| 2018/0130796 | A1* | 5/2018 | Jun ..................... H01L 27/0924 |
| 2018/0286959 | A1* | 10/2018 | Wang .................. H01L 29/4232 |
| 2019/0081152 | A1* | 3/2019 | Suh .................... H01L 21/28167 |
| 2019/0123162 | A1 | 4/2019 | Xie et al. |

* cited by examiner

SEMICONDUCTOR DEVICE HAVING A NODE CAPPING PATTERN AND A GATE CAPPING PATTERN

CROSS-REFERENCE TO RELATED APPLICATION

This application claims priority under 35 U.S.C. § 119 to Korean Patent Application No. 10-2020-0087200, filed on Jul. 15, 2020, in the Korean Intellectual Property Office, the entire contents of which are herein incorporated by reference.

BACKGROUND

Some example embodiments relate to a semiconductor device and/or a method for manufacturing/fabricating the same.

As one of scaling techniques for increasing density of a semiconductor device, a multi-gate transistor in which a multi-channel active pattern (e.g. a silicon body) having a fin and/or nanowire shape is formed on a substrate, and a gate is formed on a surface of the multi-channel active pattern has been proposed.

Since such a multi-gate transistor utilizes three-dimensional channels, scaling is easily performed. Further, the current control capability may be improved even without increasing a gate length of the multi-gate transistor. Additionally or alternatively, it is possible to effectively suppress a SCE (short channel effect) in which potential of a channel region is influenced by a drain voltage.

On the other hand, as the pitch size of the semiconductor device decreases, a research for ensuring the reduction of capacitance and/or electrical stability between contacts in the semiconductor device is required.

SUMMARY

Some example embodiments provide a semiconductor device capable of improving a structure of a node contact that connects a gate electrode and a source/drain region to improve operating characteristics and reliability of a static random access memory (SRAM) device.

Some example embodiments also provide a method for fabricating a semiconductor device capable of improving a structure of a node contact that connects a gate electrode and a source/drain region to improve operating characteristics and reliability of an SRAM.

However, example embodiments are not restricted to the one set forth herein. The above and other example embodiments will become more apparent to one of ordinary skill in the art to which example embodiments pertains by referencing the detailed description given below.

According to some example embodiments, there is provided a semiconductor device comprising a first gate structure extending in a first direction and including a first gate electrode and a first gate capping pattern, a second gate structure spaced apart from the first gate structure in the first direction, extending in the first direction, and including a second gate electrode and a second gate capping pattern, an active pattern extending in a second direction different from the first direction, the active pattern below the second gate structure, an epitaxial pattern on one side of the second gate structure and on the active pattern, a gate contact connected to the first gate electrode, and a node contact connected to the second gate electrode and to the epitaxial pattern. An upper surface of the gate contact is at a same level as an upper surface of the first gate capping pattern, and an upper surface of the node contact is lower than the upper surface of the first gate capping pattern.

According to some example embodiments, there is provided a semiconductor device comprising an active pattern, a first gate structure on the active pattern and including a first gate electrode and a first gate capping pattern, a second gate structure on the active pattern, spaced apart from the first gate structure, and including a second gate electrode and a second gate capping pattern, a first epitaxial pattern on the active pattern between the first gate structure and the second gate structure, a second epitaxial pattern on the active pattern and spaced apart from the first epitaxial pattern, a first source/drain contact on the first epitaxial pattern, a second source/drain contact on the second epitaxial pattern, and a node contact connecting the first source/drain contact and the second gate electrode, the node contact on the first source/drain contact and the second gate electrode. The first gate electrode is between the first epitaxial pattern and the second epitaxial pattern, an upper surface of the second source/drain contact is on a same level as an upper surface of the first gate capping pattern, and an upper surface of the node contact is lower than the upper surface of the first gate capping pattern.

According to some example embodiments, there is provided a semiconductor device comprising a first active pattern and a second active pattern, the first active pattern and the second active pattern each extending in a first direction and spaced apart from each other in a second direction, a first gate structure extending in the second direction, the first gate structure on the first active pattern and the second active pattern, the first gate structure including a first gate electrode and a first gate capping pattern, a second gate structure extending in the second direction, the second gate structure on the first active pattern, the second gate structure including a second gate electrode and a second gate capping pattern, a third gate structure extending in the second direction, the third gate structure on the second active pattern, the third gate structure arranged with the second gate structure along the second direction, the third gate structure including a third gate electrode and a third gate capping pattern, a gate contact connected to the second gate electrode, an upper surface of the gate contact is at a same level as an upper surface of the second gate capping pattern, a first source/drain contact placed between the first gate electrode and the second gate electrode, and between the first gate electrode and the third gate electrode, a node contact which connects the first source/drain contact and the third gate electrode on the first source/drain contact, an upper surface of the node contact being lower than an upper surface of the third gate capping pattern, a second source/drain contact which is spaced apart from the first source/drain contact in the first direction and placed on the second active pattern, an upper surface of the second source/drain contact being placed on the same level as an upper surface of the gate contact, and a wiring pattern directly connected to the second source/drain contact, on the second source/drain contact.

According to some example embodiments, there is provided a method for fabricating a semiconductor device comprising forming an epitaxial pattern on an active pattern on a substrate, forming a first gate structure on the active pattern and a second gate structure on the active pattern, wherein the first gate structure includes a first gate electrode and a first gate capping pattern, the second gate structure includes a second gate electrode and a second gate capping pattern, and the epitaxial pattern is between the first gate structure and the second gate structure, forming a source/ drain contact on the epitaxial pattern, forming a node contact which connects the source/drain contact and the first gate electrode, wherein an upper surface of the node contact is lower than an upper surface of the first gate capping pattern and lower than an upper surface of the second gate capping pattern, and forming a node capping pattern on the node contact. An upper surface of the node capping pattern is on a same level as the level of the upper surface of the first gate capping pattern and the level of the upper surface of the second gate capping pattern.

BRIEF DESCRIPTION OF THE DRAWINGS

The above and other aspects and features of example embodiments will become more apparent by describing in detail embodiments thereof referring to the attached drawings, in which.

DETAILED DESCRIPTION OF EXAMPLE EMBODIMENTS

Figure 1:
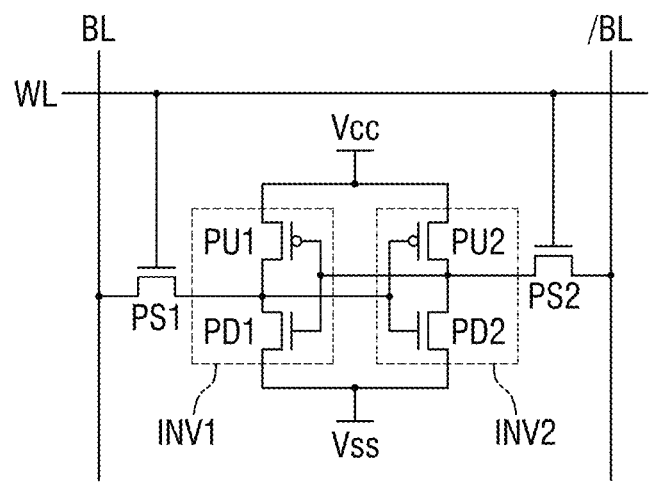
FIG. 1 is a circuit diagram for explaining a semiconductor device according to some example embodiments.

Although a fin-type transistor (FinFET) including a fin-type patterned channel region, and a transistor including nanowires and/or nanosheets are shown as an example in the drawings relating to a semiconductor device according to example embodiments, embodiments are not limited thereto. The technical idea may be applied to a planar transistor.

Alternatively or additionally, the semiconductor device according to some example embodiments may include a tunneling transistor (tunneling FET) and/or a three-dimensional (3D) transistor. The semiconductor device according to some example embodiments may also or alternatively include at least one of a bipolar junction transistor, a laterally diffused metal oxide semiconductor (LDMOS), and the like.

Figure 2:
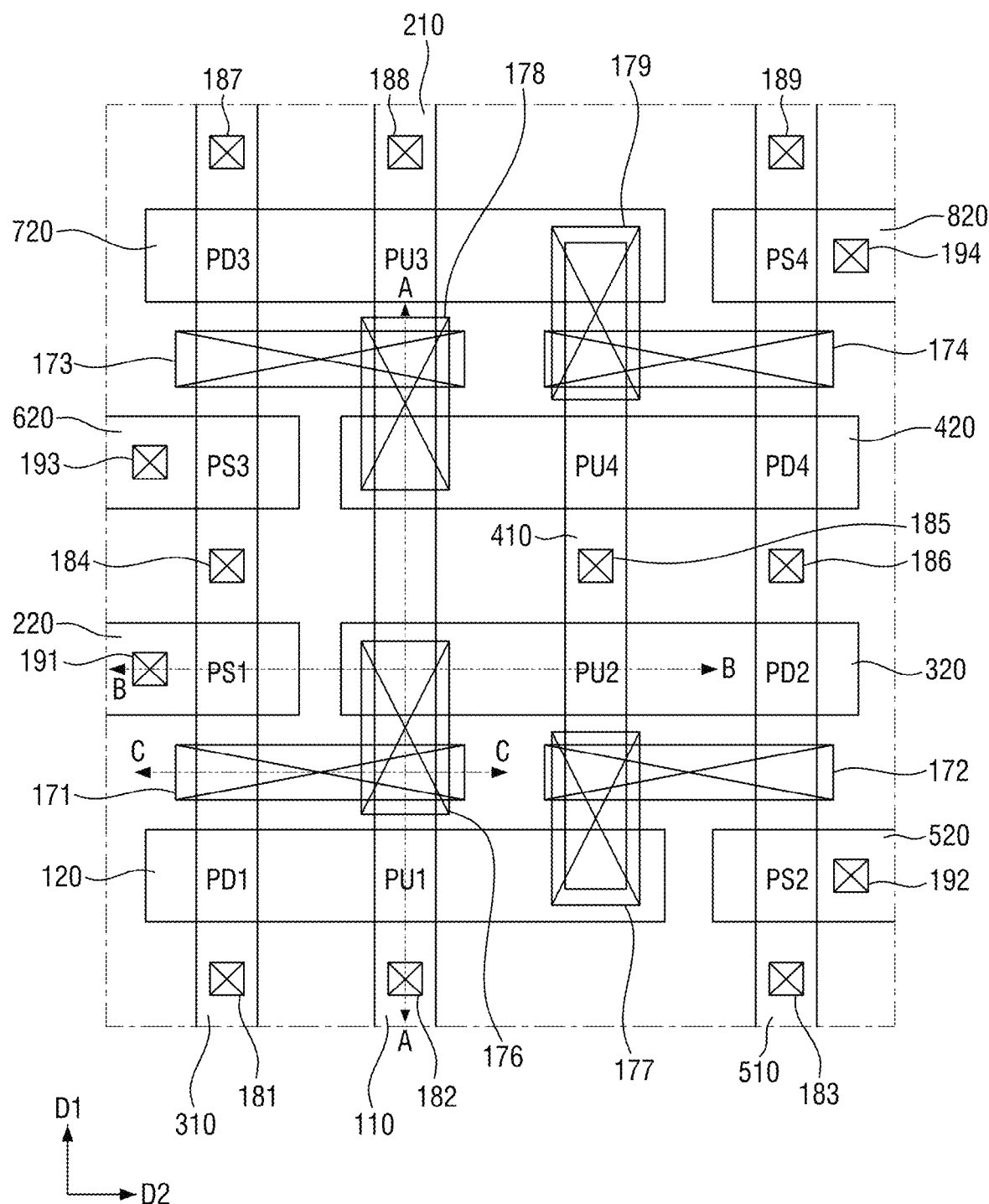
FIG. 2 is an expanded layout view of the semiconductor device explained in FIG. 1.
Figure 3:
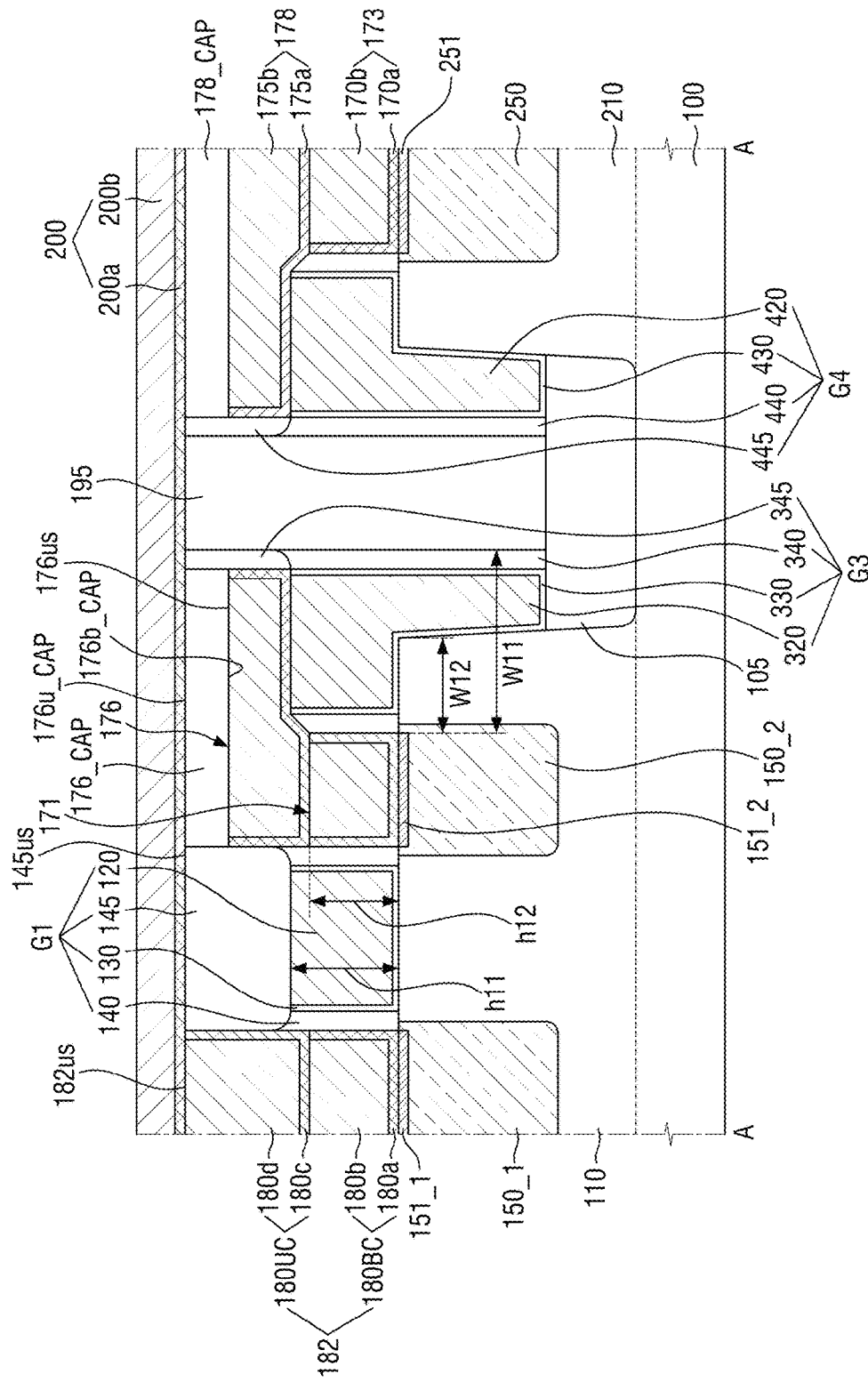
FIG. 3 is a cross-sectional view taken along A-A of FIG. 2.
Figure 4:
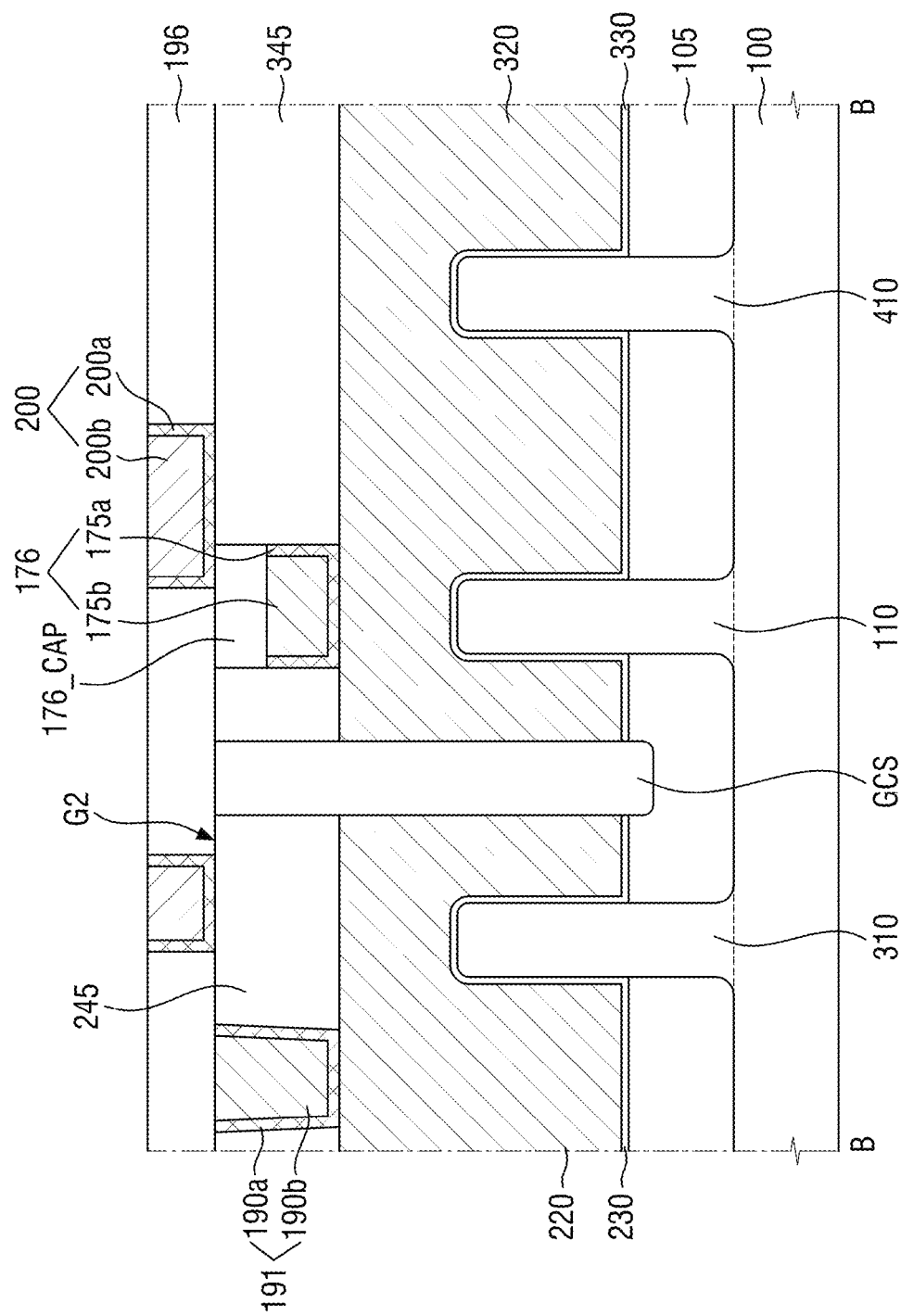
FIG. 4 is a cross-sectional view taken along B-B of FIG. 2.
Figure 5:
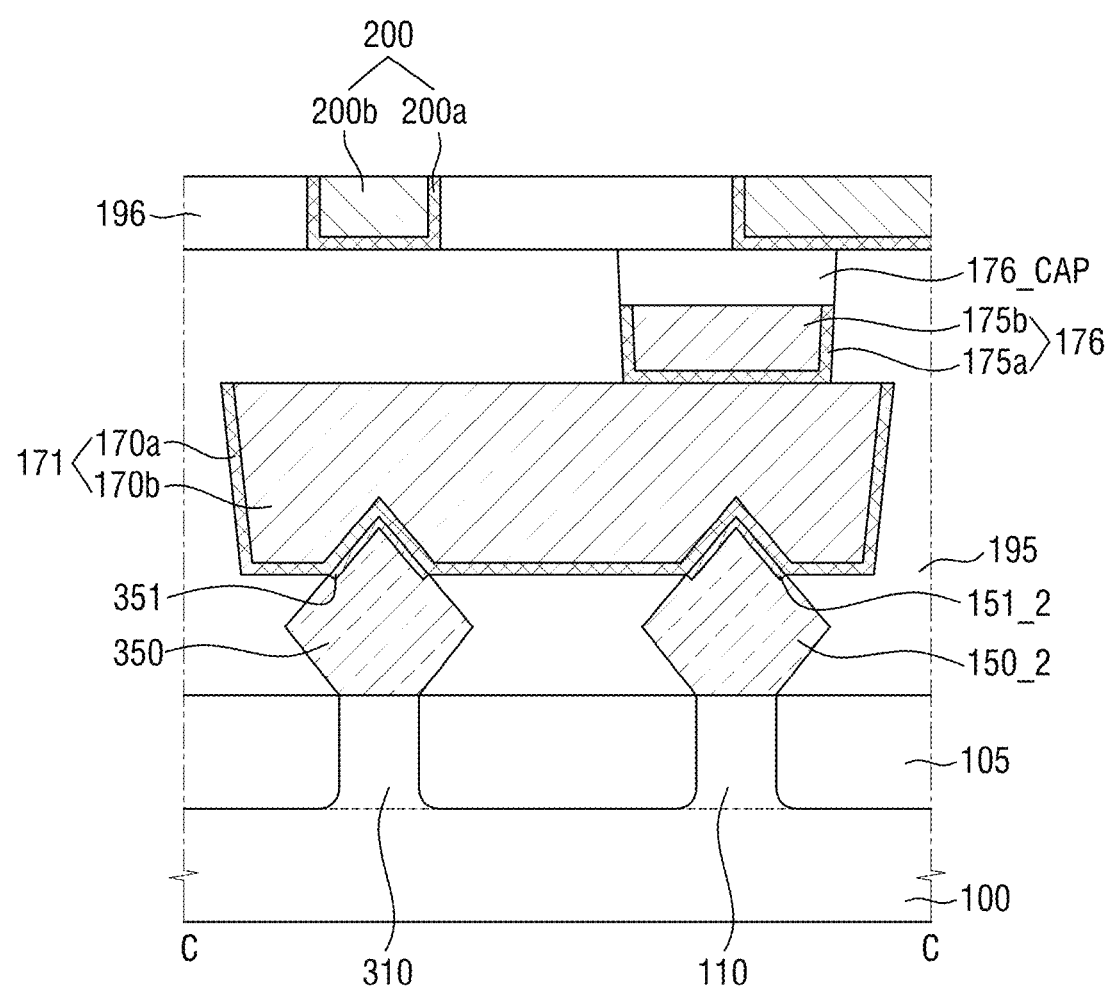
FIG. 5 is a cross-sectional view taken along C-C of FIG. 2.

FIG. 1 is a circuit diagram for explaining a semiconductor device according to some example embodiments. FIG. 2 is an expanded layout view of the semiconductor device explained in FIG. 1. FIG. 3 is a cross-sectional view taken along A-A of FIG. 2. FIG. 4 is a cross-sectional view taken along B-B of FIG. 2. FIG. 5 is a cross-sectional view taken along C-C of FIG. 2.

For reference, FIG. 2 may be an example layout view in which two pairs of inverters INV1 and INV2 explained in FIG. 1 are consecutively arranged. Also, FIG. 2 did not show a wiring line included in a BEOL (Back End Of Line).

Referring to FIG. 1, the semiconductor device according to some example embodiments may include a pair of inverters INV1 and INV2 connected in parallel between a power supply node Vcc and a ground node Vss, along with a first pass transistor PS1 and a second pass transistor PS2 connected to output nodes of each of the inverters INV1 and INV2.

The first pass transistor PS1 and the second pass transistor PS2 may be connected to a bit line BL and a complementary bit line /BL, respectively. Gates of the first pass transistor PS1 and the second pass transistor PS2 may be connected to a word line WL. The first pass transistor PS1 and the second pass transistor PS2 may be or correspond to N-type transistors; however, example embodiments are not limited thereto.

A first inverter INV1 includes a first pull-up transistor PU1 and a first pull-down transistor PD1 connected in series between the power supply node Vcc and the ground node Vss, and a second inverter INV2 may include a second pull-up transistor PU2 and a second pull-down transistor PD2 connected in series between the power supply node Vcc and the ground node Vss.

The first pull-up transistor PU1 and the second pull-up transistor PU2 may be or correspond to P-type transistors, and the first pull-down transistor PD1 and the second pull-down transistor PD2 may be N-type transistors; however, example embodiments are not limited thereto.

Also, in order for the first inverter INV1 and the second inverter INV2 to form a single latch circuit, an input node of the first inverter INV1 is connected to an output node of the second inverter INV2, and an input node of the second inverter INV2 is connected to an output node of the first inverter INV1. FIG. 1 may correspond to a memory cell such as an SRAM cell. Although FIG. 1 describes a six-transistor (6T) SRAM cell, example embodiments are not limited thereto. For example, example embodiments may be applicable to other memory cells such as a four-transistor (4T) and/or an eight-transistor (8T) memory cell.

Referring to FIGS. 2 to 5, the semiconductor devices according to some example embodiments may include active patterns 110, 210, 310, 410, and 510, gate electrodes 120, 220, 320, 420, 520, 620, 720, and 820, a plurality of bridge contacts 171, 172, 173, and 174, a plurality of node contacts 176, 177, 178, and 179, a plurality of source/drain contacts 181, 182, 183, 184, 185, 186, 187, 188, and 189 and a plurality of gate contacts 191, 192, 193, and 194.

The substrate 100 may be or include a silicon substrate or an SOI (silicon-on-insulator). Alternatively, the substrate 100 may be or include, but is not limited to, at least one of silicon germanium, SGOI (silicon germanium on insulator), indium antimonide, lead tellurium compounds, indium arsenic, indium phosphide, gallium arsenide or gallium antimonide.

The active patterns 110, 210, 310, 410, and 510 may be placed in an SRAM region. A first active pattern 110, a second active pattern 210, and a fourth active pattern 410 may be placed in a PMOS region of the SRAM. A third active pattern 310 and a fifth active pattern 510 may be placed in a NMOS region of the SRAM.

The active patterns 110, 210, 310, 410, and 510 may each protrude from the substrate 100. In the semiconductor device according to some example embodiments, the active patterns 110, 210, 310, 410, and 510 may be/each be fin-type patterns, respectively.

The active patterns 110, 210, 310, 410, and 510 may each extend long in a first direction D1. The first active pattern 110, the second active pattern 210 and the fourth active pattern 410 may be placed between the third active pattern 310 and the fifth active pattern 510 spaced apart from each other in a second direction D2.

The first active pattern 110 and the second active pattern 210 may be arranged along, e.g. collinear in, the first direction D1. The first active pattern 110 and the second active pattern 210 may be spaced apart from each other in the first direction D1. The third active pattern 310 may be spaced apart from the first active pattern 110 and the second active pattern 210 in the second direction D2. The fourth active pattern 410 may be spaced apart from the first active pattern 110 and the second active pattern 210 in the second direction D2. The fourth active pattern 410 may overlap a part of the first active pattern 110 and a part of the second active pattern 210 in the second direction D2. The first active pattern 110, the fourth active pattern 410, and the second active pattern 210 may be arranged in the first direction D1 in zigzags. The fourth active pattern 410 may be spaced apart from the fifth active pattern 510 in the second direction D2.

Each of the active patterns 110, 210, 310, 410, and 510 may be formed by etching, e.g. dry and/or wet etching, a part of the substrate 100, and may include an epitaxial layer such as a hetero-epitaxial and/or homogenous epitaxial layer, that is grown from the substrate 100. Each of the active patterns 110, 210, 310, 410, and 510 may include silicon and/or germanium, and/or other elemental semiconductor material. Each of the active patterns 110, 210, 310, 410 may have a uniform dimension, e.g. a uniform dimension in the second direction D2; alternatively, a dimension in the second dimension D2 of any of the active patterns 110, 210, 310, 410 may vary throughout an extent along the first direction D1. Alternatively or additionally, each of the first to fifth active patterns 110, 210, 310, 410, and 510 may include a compound semiconductor, and may include, for example, a group IV-IV compound semiconductor or a group III-V compound semiconductor. The group IV-IV compound semiconductor may be, for example, a binary compound and/or a ternary compound including at least two or more of carbon (C), silicon (Si), germanium (Ge), and tin (Sn), or a compound obtained by doping these elements with a group IV element. The group III-V compound semiconductor may be, for example, one of a binary compound, a ternary compound or a quaternary compound formed by combining one of aluminum (Al), gallium (Ga) and indium (In) as a group III element, and one of phosphorus (P), arsenic (As) and antimony (Sb) as a group V element.

A field insulating film 105 may be formed on the substrate 100. The field insulating film 105 may be formed on a part of the side walls of each of the active patterns 110, 210, 310, 410, and 510, and may be formed with a chemical vapor deposition (CVD) process such as a plasma-enhanced chemical vapor deposition (PECVD) process and/or a low pressure chemical vapor deposition (LPCVD) process. Each of the active patterns 110, 210, 310, 410, and 510 may protrude above the upper surface of the field insulating film 105. The field insulating film 105 may include, for example, an oxide film, a nitride film, an acid nitride film or a combination film thereof.

The gate electrodes 120, 220, 320, 420, 520, 620, 720, and 820 may each extend in the second direction D2. A first gate electrode 120 and a fifth gate electrode 520 may be arranged, e.g. arranged collinearly, along the second direction D2. The first gate electrode 120 and the fifth gate electrode 520 may be spaced apart from each other in the second direction D2. A second gate electrode 220 and a third gate electrode 320 may be arranged, e.g. arranged collinearly, along the second direction D2. The second gate electrode 220 and the third gate electrode 320 may be spaced apart from each other in the second direction D2. A fourth gate electrode 420 and a sixth gate electrode 620 may be arranged, e.g. arranged collinearly, along the second direction D2. The fourth gate electrode 420 and the sixth gate electrode 620 may be spaced apart from each other in the second direction D2. A seventh gate electrode 720 and an eighth gate electrode 820 may be arranged, e.g. arranged collinearly, along the second direction D2. The seventh gate electrode 720 and the eighth gate electrode 820 may be spaced apart from each other in the second direction D2. The first gate electrode 120, the third gate electrode 320, the fourth gate electrode 420, and the seventh gate electrode 720 may be spaced apart from each other in the first direction D1, and may be arranged at a fixed pitch; however, example embodiments are not limited thereto.

The first gate electrode 120, the second gate electrode 220, the sixth gate electrode 620, and the seventh gate electrode 720 may intersect the third active pattern 310. The first gate electrode 120 may intersect the first active pattern 110 and the fourth active pattern 410. The seventh gate electrode 720 may intersect the second active pattern 210 and the fourth active pattern 410. The third gate electrode 320, the fourth gate electrode 420, the fifth gate electrode 520, and the eighth gate electrode 820 may intersect the fifth active pattern 510. The third gate electrode 320 may intersect the first active pattern 110 and the fourth active pattern 410. The fourth gate electrode 420 may intersect the second active pattern 210 and the fourth active pattern 410. The first gate electrode 120 and the seventh gate electrode 720 may intersect the end of the fourth active pattern 410. The third gate electrode 320 may intersect the end of the first active pattern 110. The fourth gate electrode 420 may intersect the end of the second active pattern 210.

The gate electrodes 120, 220, 320, 420, 520, 620, 720, and 820 may each include, for example, at least one of metal, conductive metal nitride, conductive metal carbonitride, conductive metal carbide, metal silicide, doped semiconductor material, conductive metal oxynitride and conductive metal oxide.

An intersection between each of the gate electrodes and respective ones of the active patterns may form a component of a respective transistor. A length of a transistor may correspond to an amount of overlap in the first direction D1, and a width of a transistor may correspond to an amount of overlap in the second direction D2. As shown, the first pull-up transistor PU1 is defined around a region in which the first gate electrode 120 and the first active pattern 110 intersect, the first pull-down transistor PD1 is defined around a region in which the first gate electrode 120 and the third active pattern 310 intersect, and the first pass transistor PS1 is defined around a region in which the second gate electrode 220 and the third active pattern 310 intersect.

The second pull-up transistor PU2 is defined around a region in which the third gate electrode 320 and the fourth active pattern 410 intersect, the second pull-down transistor PD2 is defined around a region in which the third gate electrode 320 and the fifth active pattern 510 intersect, and the second pass transistor PS2 is defined around a region in which the fifth gate electrode 520 and the fifth active pattern 510 intersect.

The third pull-up transistor PU3 is defined around a region in which the seventh gate electrode 720 and the second active pattern 210 intersect, the third pull-down transistor PD3 is defined around a region in which the seventh gate electrode 720 and the third active pattern 310 intersect, and the third pass transistor PS3 is defined around a region in which the sixth gate electrode 620 and the third active pattern 310 intersect.

A fourth pull-up transistor PU4 is defined around a region in which the fourth gate electrode 420 and the fourth active pattern 410 intersect, a fourth pull-down transistor PD4 is defined around a region in which the fourth gate electrode 420 and the fifth active pattern 510 intersect, and a fourth pass transistor PS4 is defined around a region in which the eighth gate electrode 820 and the fifth fin type pattern 510 intersect.

The first and second pull-up transistors PU1 and PU2, the first and second pull-down transistors PD1 and PD2, and the first and second pass transistors PS1 and PS2 may be included in the first SRAM cell. The third and fourth pull-up transistors PU3 and PU4, the third and fourth pull-down transistors PD3 and PD4, and the third and fourth pass transistors PS3 and PS4 may be included in the second SRAM cell.

Each SRAM cell may be connected to each of the bit line BL and the complementary bit line/BL.

FIG. 2 shows that, but is not limited to, one pull-down transistor or one pass transistor is defined at a point of intersection with one active pattern. However, example embodiments are not limited thereto, and one pull-down transistor or one pass transistor may be defined at the point on which one gate electrode intersects the plurality of active patterns.

Each of the plurality of bridge contacts 171, 172, 173, and 174 may be a local interconnect or a contact that connects the source/drain region of the pull-up transistor, the source/drain region of the pull-down transistor, and the source/drain region of the pass transistor in FIG. 1. Since the bridge contacts 171, 172, 173, and 174 are connected to the source/drain region, the bridge contacts 171, 172, 173, and 174 may be/correspond to bridge source/drain contacts.

A first bridge contact 171 is connected to the source/drain region of the first pull-up transistor PU1, the source/drain region of the first pull-down transistor PD1, and the source/drain region of the first pass transistor PS1. The first bridge contact 171 may be placed between the first gate electrode 120 and the second gate electrode 220, and between the first gate electrode 120 and the third gate electrode 320. A second bridge contact 172 is connected to the source/drain region of the second pull-up transistor PU2, the source/drain region of the second pull-down transistor PD2, and the source/drain region of the second pass transistor PS2. The second bridge contact 172 may be placed between the first gate electrode 120 and the third gate electrode 320, and between the third gate electrode 320 and the fifth gate electrode 520. A third bridge contact 173 is connected to the source/drain region of the third pull-up transistor PU3, the source/drain region of the third pull-down transistor PD3, and the source/drain region of the third pass transistor PS3. The third bridge contact 173 may be placed between the fourth gate electrode 420 and the seventh gate electrode 720, and between the sixth gate electrode 620 and the seventh gate electrode 720. A fourth bridge contact 174 is connected to the source/drain region of the fourth pull-up transistor PU4, the source/drain region of the fourth pull-down transistor PD4, and the source/drain region of the fourth pass transistor PS4. The fourth bridge contact 174 may be placed between the fourth gate electrode 420 and the seventh gate electrode 720, and between the fourth gate electrode 420 and the eighth gate electrode 820.

Each of the plurality of node contacts 176, 177, 178, and 179 may be or include a contact that connects gates of the pull-up transistor and the pull-down transistor, which is connected in series between the power supply node Vcc and the ground node Vss, to the bridge contacts 171, 172, 173, and 174 in FIG. 1. Furthermore, each of or at least one of the plurality of node contacts 176, 177, 178, and 179 and/or the plurality of bridge contacts 171, 172, 173, and 174 may have a rectangular shape, or an oval shape; however, example embodiments are not limited thereto.

A first node contact 176 connects the first bridge contact 171 to the third gate electrode 320. The third gate electrode 320 may be the gate of the second pull-up transistor PU2 and the second pull-down transistor PD2. A second node contact 177 connects the second bridge contact 172 to the first gate electrode 120. The first gate electrode 120 may be or correspond to the gate of the first pull-up transistor PU1 and the first pull-down transistor PD2. A third node contact 178 connects the third bridge contact 173 to the fourth gate electrode 420. A fourth gate electrode 420 may be or correspond to the gate of the fourth pull-up transistor PU4 and the fourth pull-down transistor PD4. A fourth node contact 179 connects the fourth bridge contact 174 to the seventh gate electrode 720. A seventh gate electrode 720 may be or correspond to the gate of the third pull-up transistor PU3 and the second pull-down transistor PD3.

The plurality of source/drain contacts 181, 182, 183, 184, 185, 186, 187, 188, and 189 may be contacts connected to the power supply node Vcc, the ground node Vss, the bit line BL, and the complementary bit line/BL of FIG. 1. Each of or at least one of the plurality of source/drain contacts 181, 182, 183, 184, 185, 186, 187, 188, and 189 may be rectangular such as square-shaped or substantially square-shaped, or oval such as circular shaped; however, example embodiments are not limited thereto.

A second source/drain contact 182, a fifth source/drain contact 185 and an eighth source/drain contact 188 are connected to the power supply node Vcc. A first source/drain contact 181, a sixth source/drain contact 186 and a seventh source/drain contact 187 are connected to the ground node Vss. A third source/drain contact 183, a fourth source/drain contact 184 and a ninth source/drain contact 189 are connected to one of the bit line BL or the complementary bit line/BL.

The plurality of gate contacts 191, 192, 193, and 194 may be/correspond to contacts connected to the word line WL of FIG. 1.

Gate structures G1, G2, G3, and G4 may each extend long in the second direction D2. A first gate structure G1 and a third gate structure G3 may be placed on the first active pattern 110. For example, the first active pattern 110 may be placed below the first gate structure G1 and the third gate structure G3. The first gate structure G1 and the third gate structure G3 may intersect the first active pattern 110. A fourth gate structure G4 may be placed on the second active pattern 210. The fourth gate structure G4 may be placed on the second active pattern 210. A second gate structure G2 may be placed on the third active pattern 310. The second gate structure G2 may intersect the third active pattern 310. The fourth active pattern 410 is placed below the third gate structure G3 and may intersect the third gate structure G3.

The first gate structure G1 may be spaced apart from the second gate structure G2 and the third gate structure G3 in the first direction D1. The second gate structure G2 may be arranged with the third gate structure G3 along the second direction D2. The second gate structure G2 may be spaced apart from the third gate structure G3 in the second direction D2. The fourth gate structure G4 may be spaced apart from the third gate structure G3 in the first direction D1.

The third gate structure G3 may be placed at the end of the first active pattern 110. The third gate structure G3 may wrap the end of the first active pattern 110 protruding above the upper surface of the field insulating film 105. For example, a width W12 by which the third gate structure G3 and the first active pattern 110 overlap in the first direction D1 is smaller than a width W11 of the third gate structure G3 in the first direction D1.

Similarly, the fourth gate structure G4 may be placed at the end of the second active pattern 210. The fourth gate structure G4 may wrap the end of the second active pattern 210 protruding above the upper surface of the field insulating film 105.

The gate structures G1, G2, G3, and G4 may include gate electrodes 120, 220, 320, and 420, gate capping patterns 145, 245, 345, and 445, and gate insulating films 130, 230, 330, and 430. Further, the first gate structure G1, the third gate structure G3 and the fourth gate structure G4 may include a first gate spacer 140, a third gate spacer 340 and a fourth gate spacer 440, respectively. Although not illustrated, the second gate structure G2 also includes a second gate spacer.

The gate electrodes 120, 220, 320, and 420 are placed on the gate insulating films 130, 230, 330, and 430. The gate insulating films 130, 230, 330, and 430 may be formed along the side walls and bottom surface of the gate electrodes 120, 220, 320, and 420. For example, the second gate insulating film 230 may extend along the profile of the third active pattern 310 protruding above the upper surface of the field insulating film 105. Although not illustrated, an interface film may be further formed from the along the profile of the third active pattern 310 that protrudes above the field insulating film 105. The second gate insulating film 230 may be formed on the interface film.

The gate insulating films 130, 230, 330, and 430 may include a silicon oxide, silicon oxynitride, silicon nitride, or a high-dielectric constant material having a higher dielectric constant than silicon oxide, respectively. The high-dielectric constant material may include, for example, one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate. The gate insulating films 130, 230, 330, and 430 may be formed with a chemical vapor deposition process and/or with a thermal oxidation process; however, example embodiments are not limited thereto.

The first gate spacer 140, the third gate spacer 340, and the fourth gate spacer 440 may be placed on the side walls of the first gate electrode 120, the side walls of the third gate electrode 320, and the side walls of the fourth gate electrode 420. Although not illustrated, a second gate spacer may also be placed on the side walls of the second gate electrode 220.

The gate spacers 140, 340, and 440 may include, for example, at least one of silicon nitride (SiN), silicon oxynitride (SiON), silicon oxide ($SiO_2$), silicon oxycarbonitride (SiOCN), silicon boron nitride (SiBN), silicon oxyboron nitride (SiOBN), silicon oxycarbide (SiOC) and combinations thereof. Although the gate spacers 140, 340, and 440 are shown as single films, this is only for convenience of explanation, and the embodiment are not limited thereto.

The gate capping patterns 145, 245, 345, and 445 may be placed on the gate electrodes 120, 220, 320, and 420 and the gate insulating films 130, 230, 330, and 430. For example, although a first gate capping pattern 145 is shown as being placed on the upper surface of the first gate spacer 140, the embodiment is not limited thereto. The first gate capping pattern 145 may be placed between the first gate spacers 140. In such a case, an upper surface 145*us* of the first gate capping pattern may be placed on the same plane as (e.g. coplanar) the upper surface of the first gate spacer 140. Alternatively, the first gate insulating film 130 may be placed between the side wall of the first gate capping pattern 145 and the side wall of the first gate spacer 140 that face each other.

Since the gate capping patterns 145, 245, 345, and 445 are formed in the same fabricating process, the upper surfaces of the gate capping patterns 145, 245, 345, and 445 may be placed on the same level, e.g. the same plane. The gate capping patterns 145, 245, 345, and 445 may include, for example, at least one of silicon nitride (SiN), silicon oxynitride (SiON), silicon oxide ($SiO_2$), silicon carbonitride (SiCN), silicon oxycarbonitride (SiOCN) and combinations thereof.

A gate separation pattern GCS may be placed between the gate electrodes 120, 220, 320, 420, 520, 620, 720, and 820 adjacent to each other in the second direction D2. For example, the gate separation pattern GCS may be placed between the second gate electrode 220 and the third gate electrode 320. The gate separation pattern GCS may separate the second gate electrode 220 and the third gate electrode 320. The gate separation pattern GCS is placed between the second gate structure G2 and the third gate structure G3, and may separate the second gate structure G2 and the third gate structure G3.

An upper surface of the gate separation pattern GCS may be placed on the same level, e.g. the same plane as (e.g. coplanar) the upper surfaces of the gate capping patterns 145, 245, 345, and 445. For example, the upper surface of the gate separation pattern GCS may be placed on the same level, e.g. the same plane as (e.g. coplanar) the upper surface of the second gate capping pattern 245 and the upper surface of the third gate capping pattern 345.

Although a part of the gate separation pattern GCS is shown to enter the field insulating film 105, example embodiments are not limited thereto. The gate separation pattern GCS may include, for example, at least one of silicon nitride, silicon oxide, silicon carbonitride, silicon oxycarbide, silicon oxynitride and silicon oxycarbonitride. Although the gate separation pattern GCS is shown as a single film, this is only for convenience of explanation, and the embodiment is not limited thereto.

In the semiconductor device according to some example embodiments, the second gate insulating film 230 and the third gate insulating film 330 may not extend along the side walls of the gate separation pattern GCS. In other words, the second gate electrode 220 and the third gate electrode 320 may be in contact with the gate separation pattern GCS.

First epitaxial pattern 150_1 and 150_2 may be placed on the first active pattern 110. A first epitaxial pattern 150_1 and a first epitaxial pattern 150_2 are spaced apart from each other in the first direction D1. The first epitaxial pattern 150_1 may be placed on one side of the first gate structure G1. The first epitaxial pattern 150_2 may be placed on the other side of the first gate structure G1. The first epitaxial pattern 150_2 may be placed between the first gate structure G1 and the third gate structure G3. The first gate structure G1 may be placed between the first epitaxial pattern 150_1 and the first epitaxial pattern 150_2. The first epitaxial patterns 150_1 and 150_2 may be homogenous or heterogeneous epitaxial patterns; however, example embodiments are not limited thereto.

A second epitaxial pattern 250 may be placed on the second active pattern 210. The second epitaxial pattern 250 may be placed between the fourth gate electrode 420 and the seventh gate electrode 720. A third epitaxial pattern 350 may be placed on the third active pattern 310. The third epitaxial pattern 350 may be placed between the first gate electrode 120 and the second gate electrode 220. Although not illustrated, the epitaxial pattern as explained above may be placed on the active patterns 110, 210, 310, 410, and 510 between the gate electrodes 120, 220, 320, 420, 520, 620, 720, and 820 adjacent to each other in the first direction D1. The second epitaxial pattern 250 and/or the third epitaxial pattern 340 may be homogenous or heterogeneous epitaxial patterns; however, example embodiments are not limited thereto The epitaxial patterns 150_1 and 150_2, 250, and 350 may be included in, or correspond to, the source/drain regions of respective transistors.

A first bridge contact 171 may be formed over the first active pattern 110 and the third active pattern 310. The first bridge contact 171 may be placed on the first epitaxial pattern 150_2 and the third epitaxial pattern 350. The first bridge contact 171 may connect the first epitaxial pattern 150_2 and the third epitaxial pattern 350. The first bridge contact 171 may not be in contact with the field insulating film 105.

The third bridge contact 173 may be formed over the second active pattern 210 and the third active pattern 310. The third bridge contact 173 may be placed on the second epitaxial pattern 250.

The first bridge contact 171 and the third bridge contact 173 may include a bridge barrier film 170a, and a bridge filling film 170b on the bridge barrier film 170a, respectively. The bridge barrier film 170a may extend along the side walls and bottom surface of the bridge filling film 170b. Although not illustrated, the second bridge contact 172 and the fourth bridge contact 174 may also include the bridge barrier film 170a and the bridge filling film 170b.

Unlike the shown case, the first bridge contact 171 and third bridge contact 173 may not include the bridge barrier film 170a.

In the semiconductor device according to some example embodiments, a height h11 from the upper surface of the first active pattern 110 to the upper surface of the first gate electrode 120 may be higher than a height h12 from the upper surface of the first active pattern 110 to the upper surface of the first bridge contact 171. That is, the upper surface of the bridge contact may be lower than the upper surface of the gate electrode, on the basis of the upper surface of the active pattern.

The first node contact 176 may be placed on the first bridge contact 171 and the third gate electrode 320. The first node contact 176 may connect the first bridge contact 171 and the third gate electrode 320. The first node contact 176 may connect the third gate electrode 320 and the first epitaxial pattern 150_2. An upper surface 176us of the first node contact is lower than an upper surface 145us of the first gate capping pattern and then upper surface of the third gate capping pattern 345. The height of the upper surface 176us of the first node contact is lower than the height of the upper surface 145us of the first gate capping pattern and the height of the upper surface of the third gate capping pattern 345, on the basis of the upper surface of the first active pattern 110.

The third node contact 178 may be placed on the third bridge contact 173 and the fourth gate electrode 420. The third node contact 178 may connect the third bridge contact 173 and the fourth gate electrode 420. The third node contact 178 may connect the fourth gate electrode 420 and the second epitaxial pattern 250.

The first node contact 176 and the third node contact 178 may include a node barrier film 175a, and a node filling film 175b on the node barrier film 175a, respectively. The node barrier film 175a may extend along the side walls and bottom surface of the node filling film 175b. Although not illustrated, the second node contact 177 and the fourth node contact 179 may also include the node barrier film 175a and the node filling film 175b.

Example embodiments are not limited thereto. For example, the first node contact 176 and third node contact 178 may not include the node barrier film 175a. Further, although some of the first gate capping pattern 345 and the fourth gate capping pattern 445 are shown as remaining on the side wall portions of the first node contact 176 and the third node contact 178, example embodiments are not limited thereto.

A first node capping pattern 176_CAP may be placed on the first node contact 176. The first node capping pattern 176_CAP may include a lower surface 176b_CAP facing the first node contact 176, and an upper surface 176u_CAP opposite to the lower surface 176b_CAP of the first node capping pattern. The upper surface 176u_CAP of the first node capping pattern may be placed on the same level, e.g. the same plane as (e.g. coplanar) the upper surface 145us of the first gate capping pattern, the upper surface of the second gate capping pattern 245 and the upper surface of the third gate capping pattern 345.

A third node capping pattern 178_CAP may be placed on the third node contact 178. An upper surface of the third node capping pattern 178_CAP may be placed on the same level, e.g. the same plane as (e.g. coplanar) the upper surface of the fourth gate capping pattern 445. Although not illustrated, a node capping pattern may be placed on the second node contact 177 and the fourth node contact 179.

In the semiconductor device according to some example embodiments, the width of the lower surface 176b_CAP of the first node capping pattern in the first direction D1 is the same as the width of the upper surface 176us of the first node contact in the first direction D1, and the width of the lower surface 176b_CAP of the first node capping pattern in the second direction D2 may be the same as the width of the upper surface 176us of the first node contact in the second direction D2.

The first node capping pattern 176_CAP and the third node capping pattern 178_CAP may include, for example, at least one of silicon nitride, silicon oxide, silicon carbonitride, silicon oxycarbide, silicon oxynitride and silicon oxycarbonitride.

The second source/drain contact 182 may be placed on the first epitaxial pattern 150_1. The second source/drain contact 182 is connected to the first epitaxial pattern 150_1. An upper surface 182us of the second source/drain contact may be placed on the same level, e.g. the same level, e.g. the same plane as (e.g. coplanar) the upper surface 145us of the first gate capping pattern.

The second source/drain contact 182 may include a lower source/drain contact 180BC, and an upper source/drain contact 180UC on the lower source/drain contact 180BC. The lower source/drain contact 180BC may include a lower source contact barrier film 180a, and a lower source contact filling film 180b on the lower source contact barrier film 180a. The lower source contact barrier film 180a may extend along the side walls and bottom surface of the lower source contact filling film 180b. The upper source/drain contact 180UC may include an upper source contact barrier film 180c, and an upper source contact filling film 180d on the upper source contact barrier film 180c. The upper source contact barrier film 180c may extend along the side walls and bottom surface of the upper source contact filling film 180d. The upper surface of the upper source/drain contact 180UC may be placed on the same level, e.g. the same plane as (e.g. coplanar) the upper surface 145us of the first gate capping pattern.

Example embodiments are not limited thereto. For example, the second source/drain contact 182 may not include at least one of the lower source contact barrier film 180a and the source contact barrier film 180c.

A height from the upper surface of the first active pattern 110 to the upper surface of the lower source/drain contact 180BC may be lower than the height h11 from the upper surface of the first active pattern 110 to the upper surface of the first gate electrode 120. For example, the lower source/drain contact 180BC may be, but is not limited to, formed at the same level as the bridge contacts 171, 172, 173, and 174. Here, the expression "same level" means that they are formed by the same fabricating process.

Although not shown, explanation of the remaining source/drain contacts 181, 184, 184, 185, 186, 187, 188, and 189 may also be substantially the same as that of the second source/drain contact 182.

A first silicide film 151_1 may be placed between the first epitaxial pattern 150_1 and the second source/drain contact 182. A first silicide film 151_2 may be placed between the first epitaxial pattern 150_2 and the first bridge contact 171. The second silicide film 251 may be placed between the second epitaxial pattern 250 and the third bridge contact 173. A third silicide film 351 may be placed between the third epitaxial pattern 350 and the first bridge contact 171. Each of the silicide films 151_1, 151_2, 251, and 351 may include a metal silicide material.

A first gate contact 191 may be placed on the second gate electrode 220. The first gate contact 191 is connected to the second gate electrode 220. The upper surface of the first gate contact 191 may be placed on the same level, e.g. the same plane as (e.g. coplanar) the upper surface of the second gate capping pattern 245. The upper surface of the first gate contact 191 may be placed on the same level, e.g. the same plane as (e.g. coplanar) the upper surface 176u_CAP of the first node capping pattern.

The first gate contact 191 may include a gate contact barrier film 190a, and a gate contact filling film 190b on the gate contact barrier film 190a. The gate contact barrier film 190a may extend along the side walls and bottom surface of the gate contact filling film 190b.

Example embodiments are not limited thereto. For example, the first gate contact 191 may not include the gate contact barrier film 190a.

Additionally, explanation of the second to fourth gate contacts 192, 193, and 194 is also substantially the same as explanation of the first gate contact 191.

The bridge barrier film 170a, the node barrier film 175a, the lower source contact barrier film 180a, the upper source contact barrier film 180c and the gate contact barrier film 190a may include, for example, at least or exactly one of tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Jr), rhodium (Rh) and two-dimensional (2D) material. In the semiconductor device according to some example embodiments, the two-dimensional material may be a metallic material and/or a semiconductor material. The two-dimensional (2D) material may include two-dimensional allotrope or two-dimensional compounds compound, and may include, for example, but is not limited to, at least one of graphene, molybdenum disulfide ($MoS_2$), molybdenum diselenide ($MoSe_2$), tungsten diselenide ($WSe_2$), and tungsten sulfide ($WS_2$). For example, since the above-mentioned two-dimensional materials are only listed as an example, the two-dimensional materials that may be included in the semiconductor device of the present disclosure are not limited by the above-mentioned materials.

The bridge filling film 170b, the node filling film 175b, the lower source contact filling film 180b, the upper source contact filling film 180d and the gate contact filling film 190b may include, for example, at least one of aluminum (Al), tungsten (W), cobalt (Co), ruthenium (Ru), silver (Ag), gold (Au), manganese (Mn) and molybdenum (Mo).

A first interlayer insulating film 195 may be placed on the field insulating film 105. The upper surface of the first interlayer insulating film 195 may be placed on the same level, e.g. the same plane as (e.g. coplanar) the upper surfaces of the gate capping patterns 145, 245, 345, and 445.

The second interlayer insulating film 196 may be placed on the first interlayer insulating film 195. The first interlayer insulating film 195 and the second interlayer insulating film 196 may include, for example, at least one of silicon oxide, silicon nitride, silicon oxynitride and a low-dielectric constant material, respectively. The low-dielectric constant material may include, for example, but is not limited to, at least one or exactly one of Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica or combinations thereof.

A wiring pattern 200 may be placed in the second interlayer insulating film 196. The wiring pattern 200 may, for example, extend long in the first direction D1, but is not limited thereto. For example, the wiring pattern 200 may be a connection wiring of the lowest level among the connection wirings included in the BEOL structure.

The wiring pattern 200 may be connected to at least one or more of the source/drain contacts 181, 182, 183, 184, 185, 186, 187, 188, and 189. For example, the wiring pattern 200 may be connected to a second source/drain contact 182. As an example, the width of the wiring pattern 200 (e.g., the width in the second direction D2) may vary depending on which terminal of FIG. 1 the wiring pattern is connected. As another example, the width of the wiring pattern 200 in the second direction D2 may be the same.

The wiring pattern 200 may be connected to the second source/drain contact 182 without using a via structure. The wiring pattern 200 may be directly connected to the second source/drain contact 182. For example, the bottom surface of the wiring pattern 200 that extends long in the first direction D1 may be in contact with the first gate capping pattern 145 and the first node capping pattern 176_CAP. The height from the first epitaxial pattern 150_1 to the wiring pattern 200 may be reduced, by not using a via structure between the wiring pattern 200 and the second source/drain contact 182. As the height to the wiring pattern 200 decreases, the resistance between the source/drain region of the transistor and the wiring pattern 200 may decrease. The operating performance and reliability of the semiconductor device can be improved accordingly.

The wiring pattern 200 may include a wiring barrier film, and a wiring filling film 200b on the wiring barrier film 200a. The wiring barrier film 200a may extend along the side walls and bottom surface of the wiring filling film 200b. Example embodiments are not limited thereto. For example, the wire pattern 200 may not include the wiring barrier film 200a.

The wiring barrier film 200a may include, for example, at least one of tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), zirconium (Zr), zirconium nitride (ZrN), vanadium (V), vanadium nitride (VN), niobium (Nb), niobium nitride (NbN), platinum (Pt), iridium (Jr), rhodium (Rh), and a two-dimensional (2D) material. The wiring filling film 200b may include, for example, at least one of aluminum (Al), copper (Cu), tungsten (W), cobalt (Co), ruthenium (Ru) and molybdenum (Mo).

Figure 6:
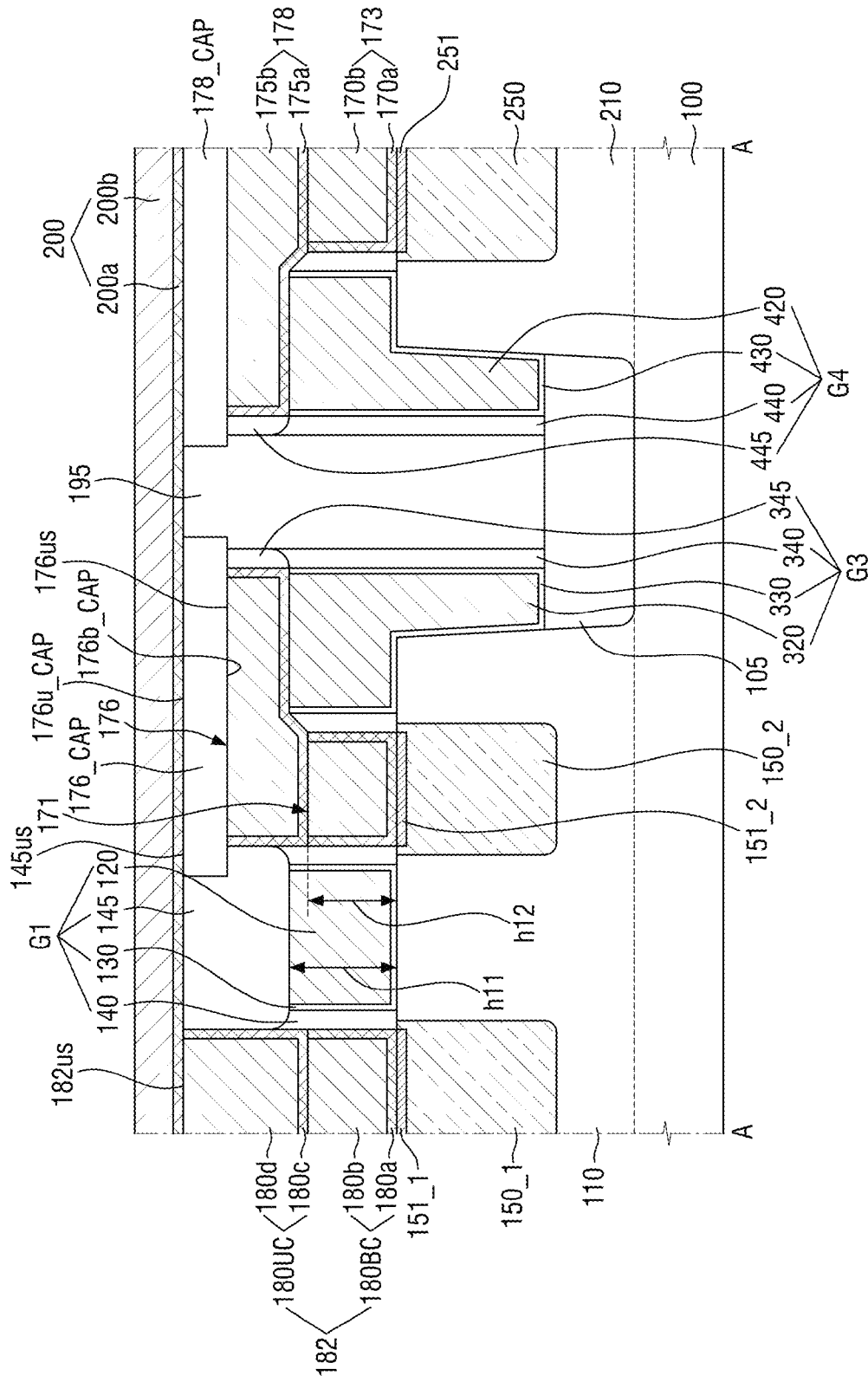
FIGS. 6 and 7 are diagrams for explaining the semiconductor device according to some example embodiments.
Figure 7:
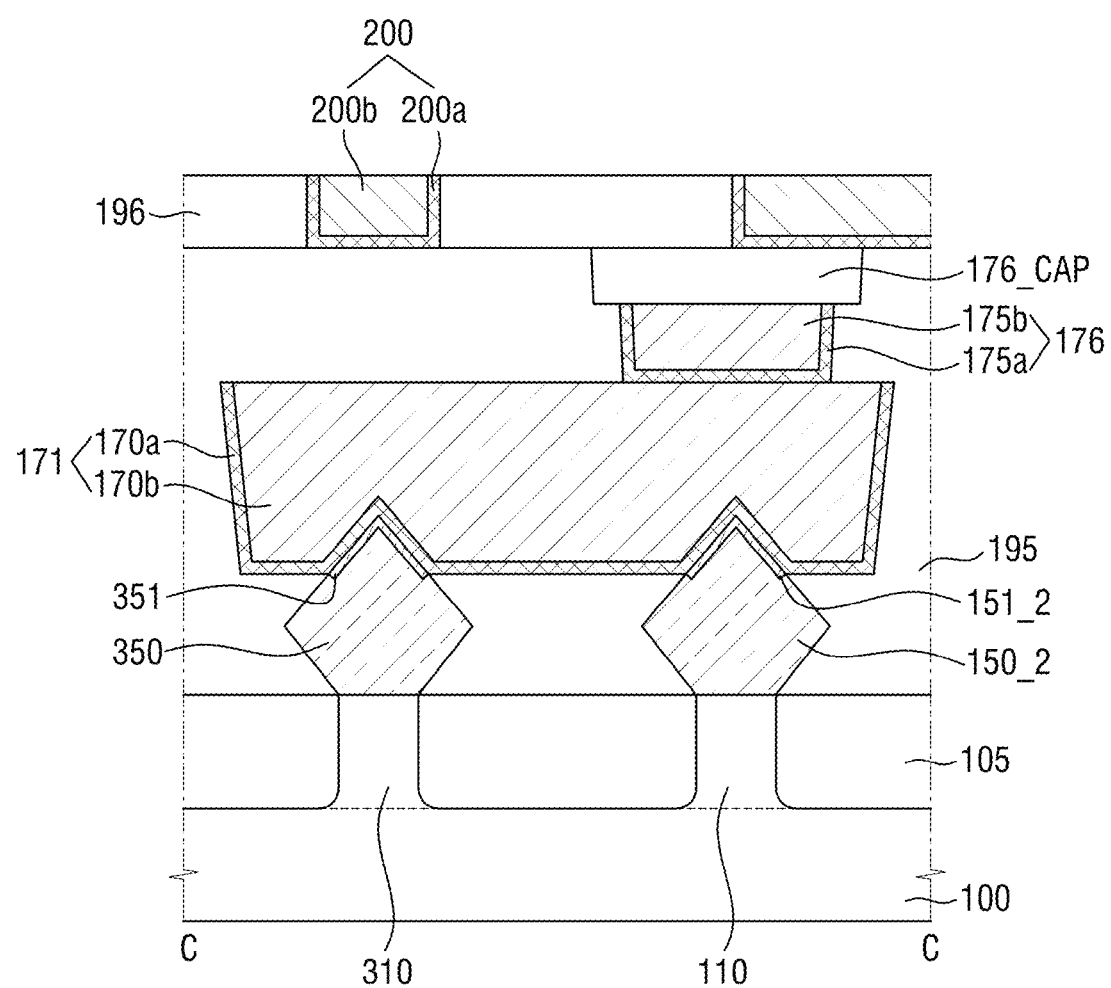

FIGS. 6 and 7 are diagrams for explaining the semiconductor device according to some example embodiments. For convenience of explanation, points different from those explained using FIGS. 1 to 5 will be mainly explained.

Referring to FIGS. 6 and 7, in the semiconductor device according to some example embodiments, the width of the lower surface 176b_CAP of the first node capping pattern in the first direction D1 is larger than the width of the upper surface 176us of the first node contact in the first direction D1.

Further, the width of the lower surface 176b_CAP of the first node capping pattern in the second direction D2 is larger than the width of the upper surface 176us of the first node contact in the second direction D2.

For example the side walls of the first node capping pattern 176_CAP are not aligned with the side walls of the first node contact 176.

Figure 8:
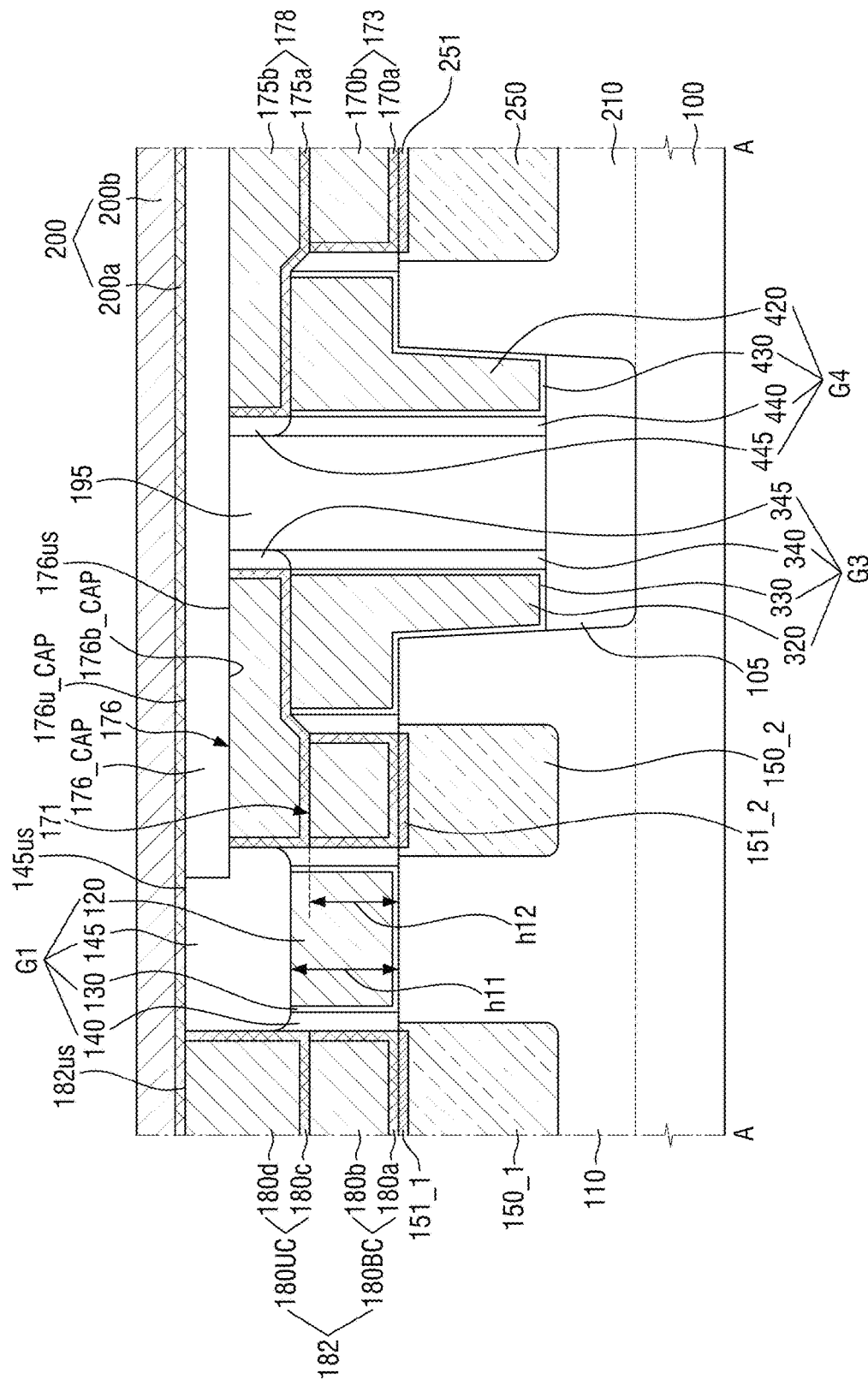
FIG. 8 is a diagram for explaining the semiconductor device according to some example embodiments.

FIG. 8 is a diagram for explaining the semiconductor device according to some example embodiments. For convenience of explanation, points different from those explained using FIGS. 6 and 7 will be mainly explained.

Referring to FIG. 8, in the semiconductor device according to some example embodiments, the first node capping pattern 176_CAP may be placed on the first node contact 176 and the third node contact 178.

The first node capping pattern 176_CAP may cover the upper surface 176us of the first node contact and the upper surface of the third node contact 178 at once.

For example, the first node capping pattern 176_CAP extends long in the first direction D1 in FIG. 2 to cover the first node contact 176 and the third node contact 178 adjacent to each other in the first direction D1. After forming the upper surfaces of the first node contact 176 and the third node contact 178 to be lower than the upper surface 145us of the first gate capping pattern, the first node capping pattern 176_CAP that covers the first node contact 176 and the third node contact 178 at the same time may be formed.

Unlike the shown case, the first node capping pattern 176_CAP extends long in the second direction D2 in FIG. 2, and may cover the first node contact 176 and the second node contact 178 adjacent to each other in the second direction D2.

Figure 9:
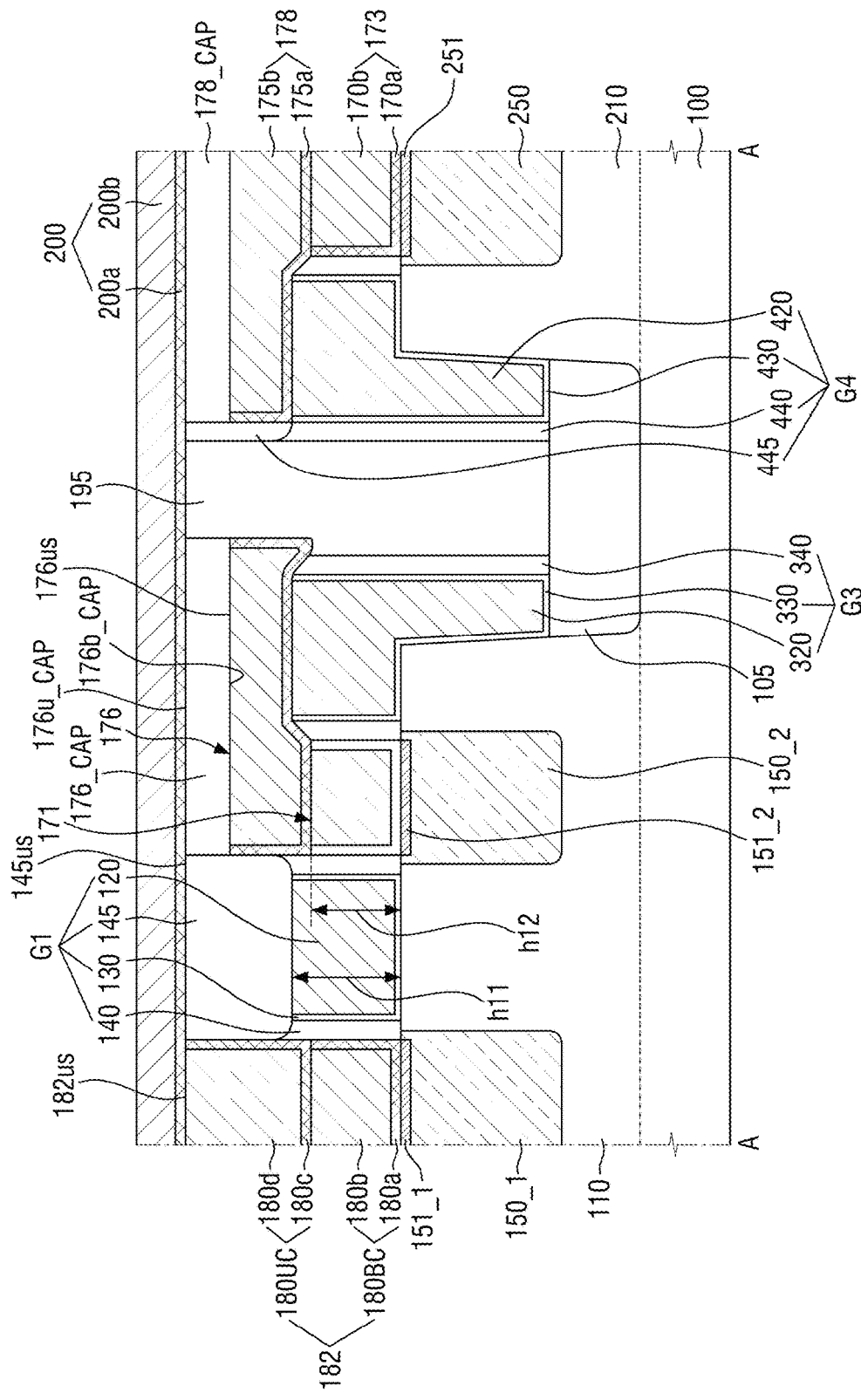
FIG. 9 is a diagram for explaining the semiconductor device according to some example embodiments.
Figure 10:
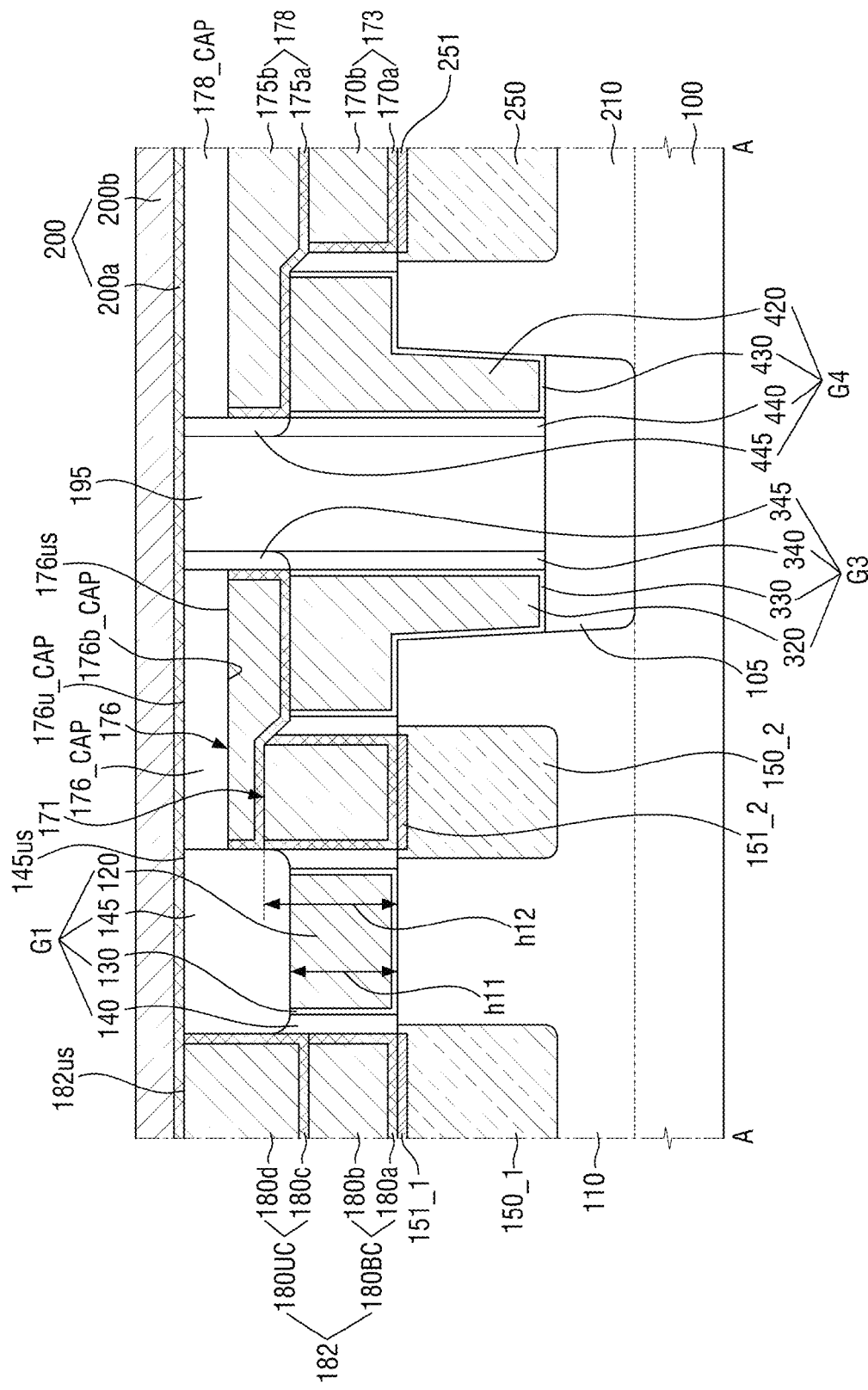
FIG. 10 is a diagram for explaining the semiconductor device according to some example embodiments.
Figure 11:
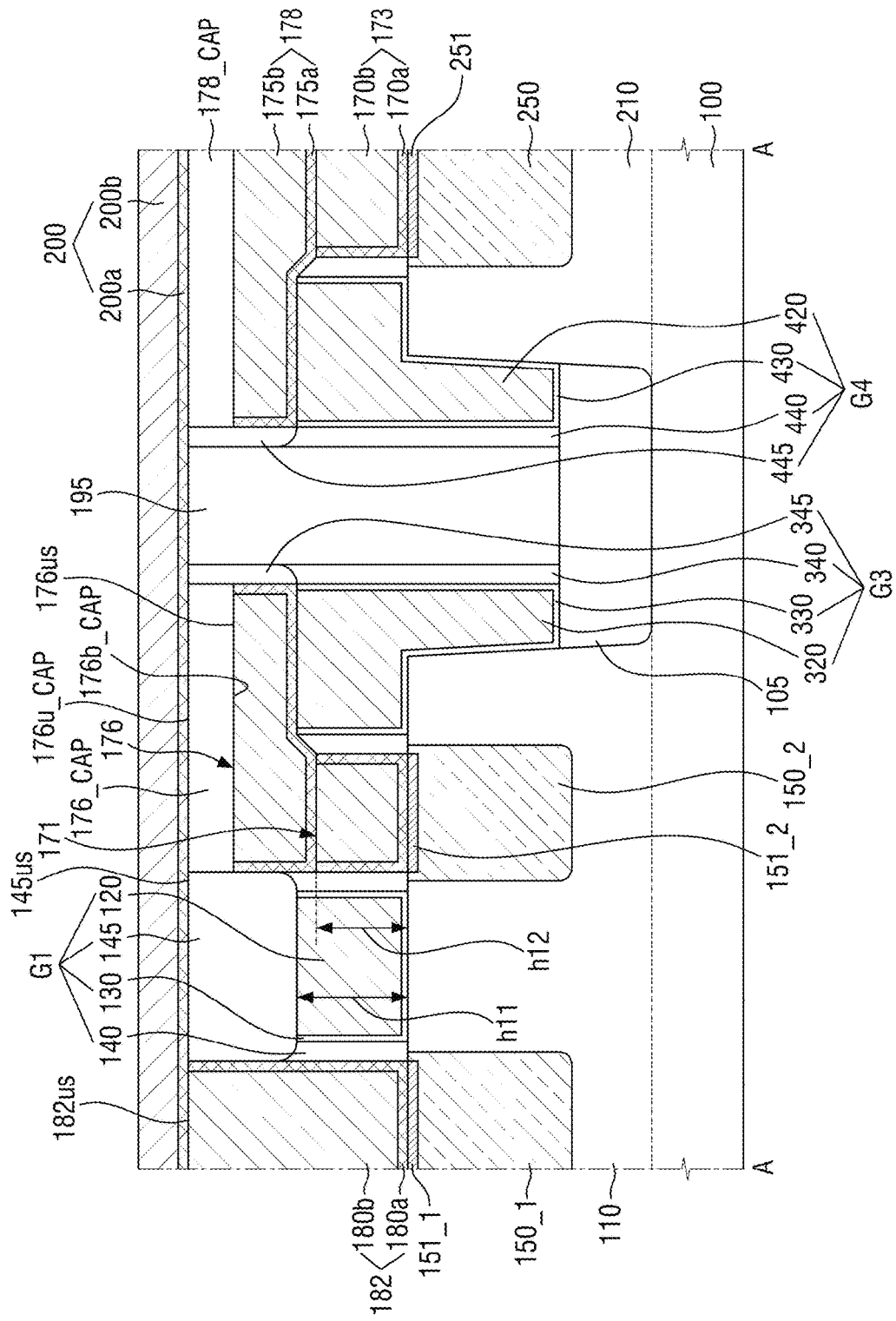
FIG. 11 is a diagram for explaining the semiconductor device according to some example embodiments.

FIG. 9 is a diagram for explaining the semiconductor device according to some example embodiments. FIG. 10 is a diagram for explaining the semiconductor device according to some example embodiments. FIG. 11 is a diagram for explaining the semiconductor device according to some example embodiments. For convenience of explanation, points different from those explained using FIGS. 1 to 5 will be mainly explained.

Referring to FIG. 9, in the semiconductor device according to some example embodiments, a part of the first node contact 176 may further extend from the third gate structure G3 in the first direction D1.

The first node contact 176 may extend along a part of the side walls of the third gate electrode 320 in the direction toward the substrate 100.

During the fabricating process, misalignment may occur due to process margins and the like. In such a case, a part of the first node contact 176 may be further extended in the first direction D1 beyond the third gate structure G3.

Example embodiments are not limited thereto. For example, the third node contact 178 may, of course, have the same shape as that of the first node contact 176.

Referring to FIG. 10, in the semiconductor device according to some example embodiments, the height h11 from the upper surface of the first active pattern 110 to the upper surface of the first gate electrode 120 may be lower than the height h12 from the upper surface of the first active pattern 110 to the upper surface of the first bridge contact 171.

For example, the upper surface of the bridge contact may be higher than the upper surface of the gate electrode, on the basis of the upper surface of the active pattern.

Referring to FIG. 11, in the semiconductor device according to some example embodiments, the second source/drain contact 182 may have an integral structure.

The second source/drain contact 182 may include a lower source contact barrier film 180a and a lower source contact filling film 180b formed at the same level as the bridge barrier film 170a and the bridge filling film 170b.

Figure 12:
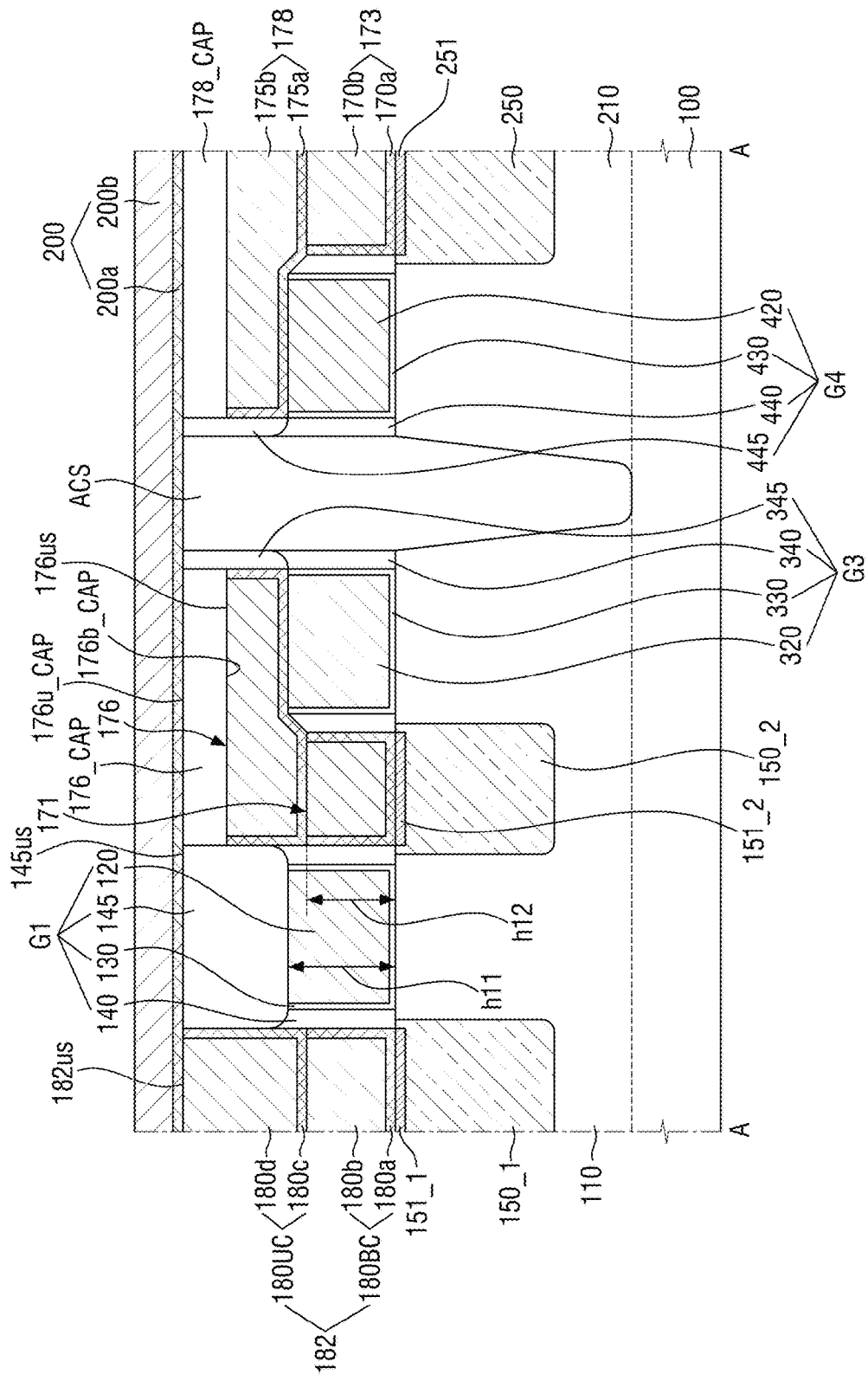
FIG. 12 is a diagram for explaining the semiconductor device according to some example embodiments.
Figure 13:
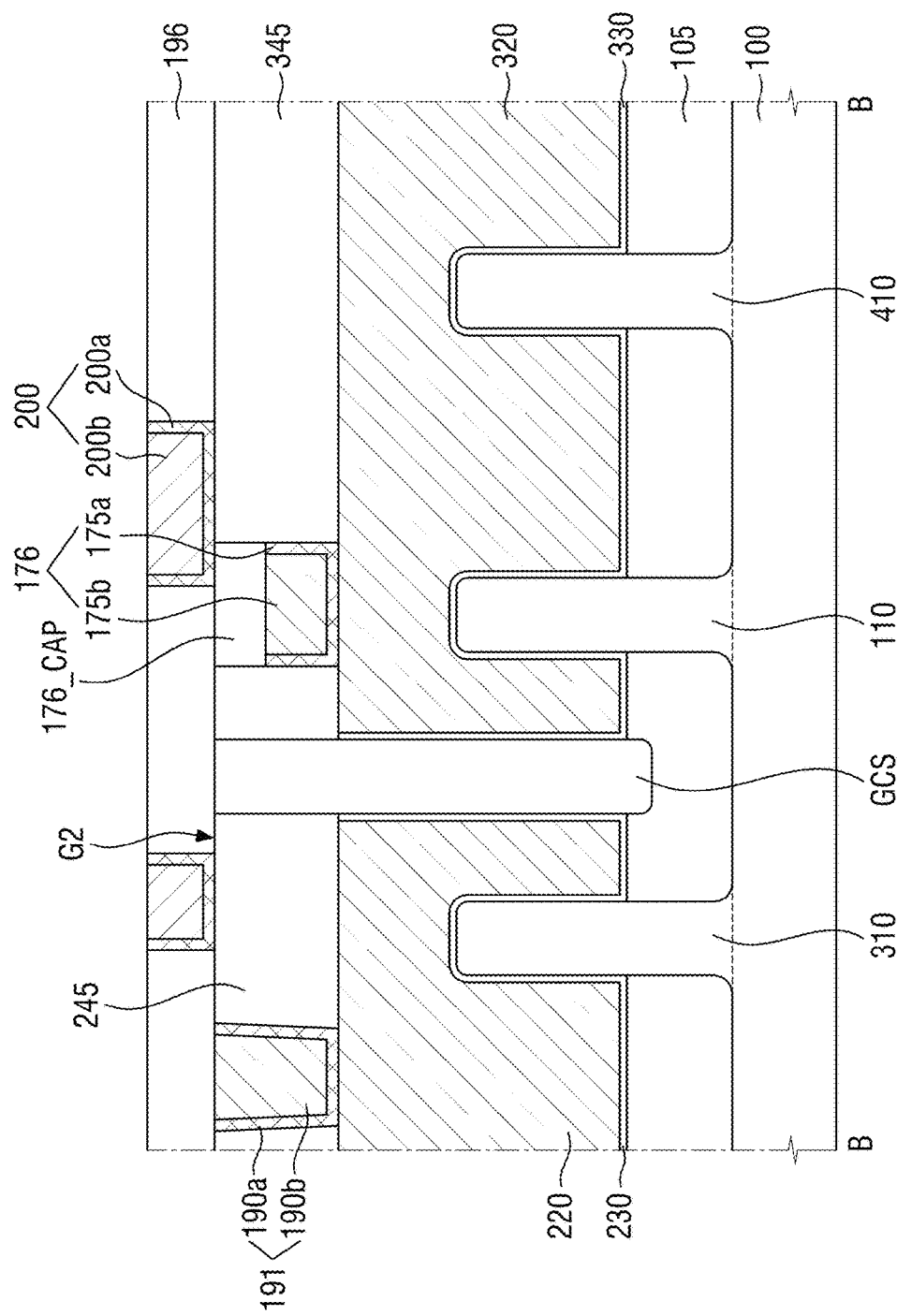
FIG. 13 is a diagram for explaining the semiconductor device according to some example embodiments.
Figure 14:
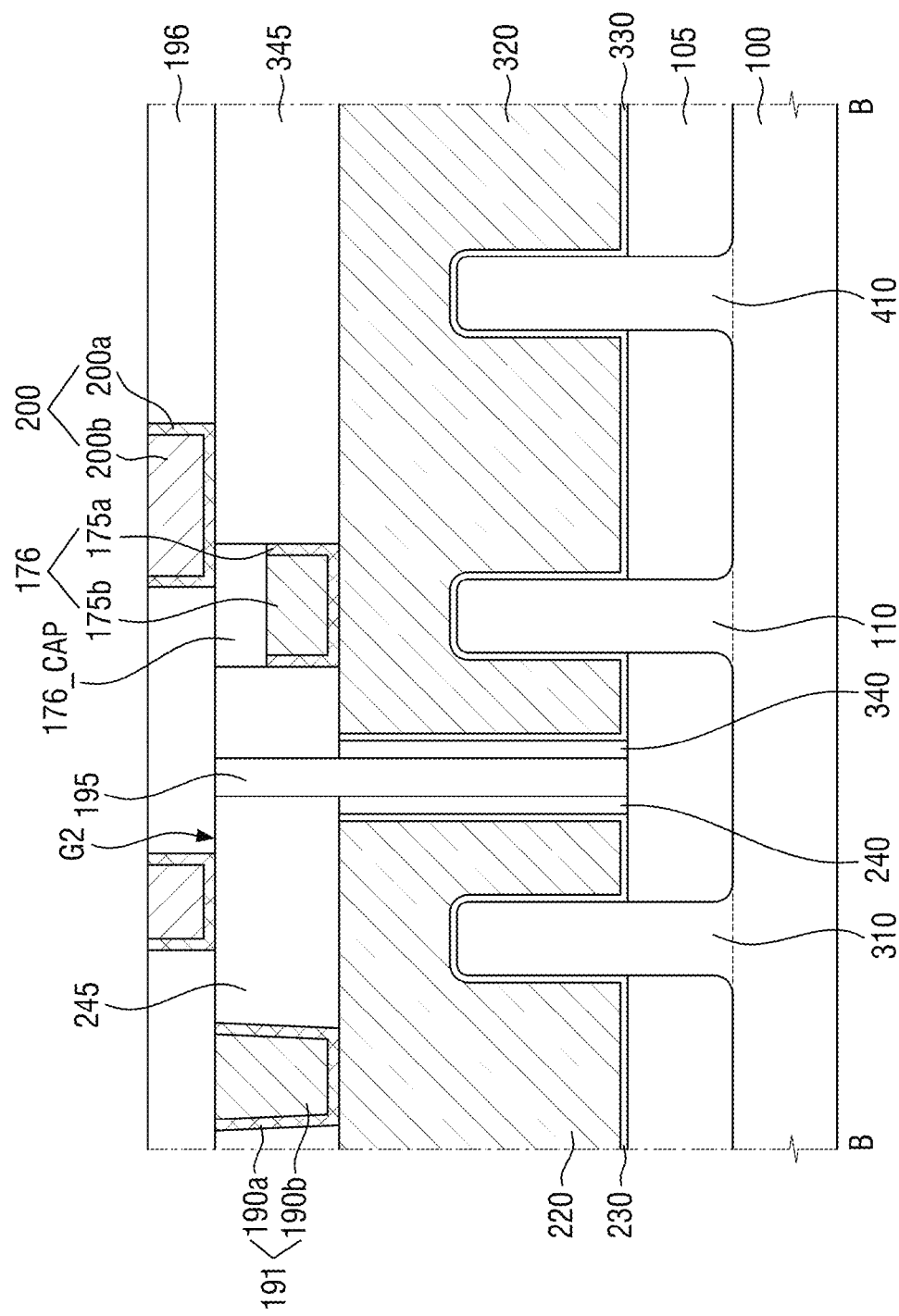
FIG. 14 is a diagram for explaining the semiconductor device according to some example embodiments.
Figure 15:
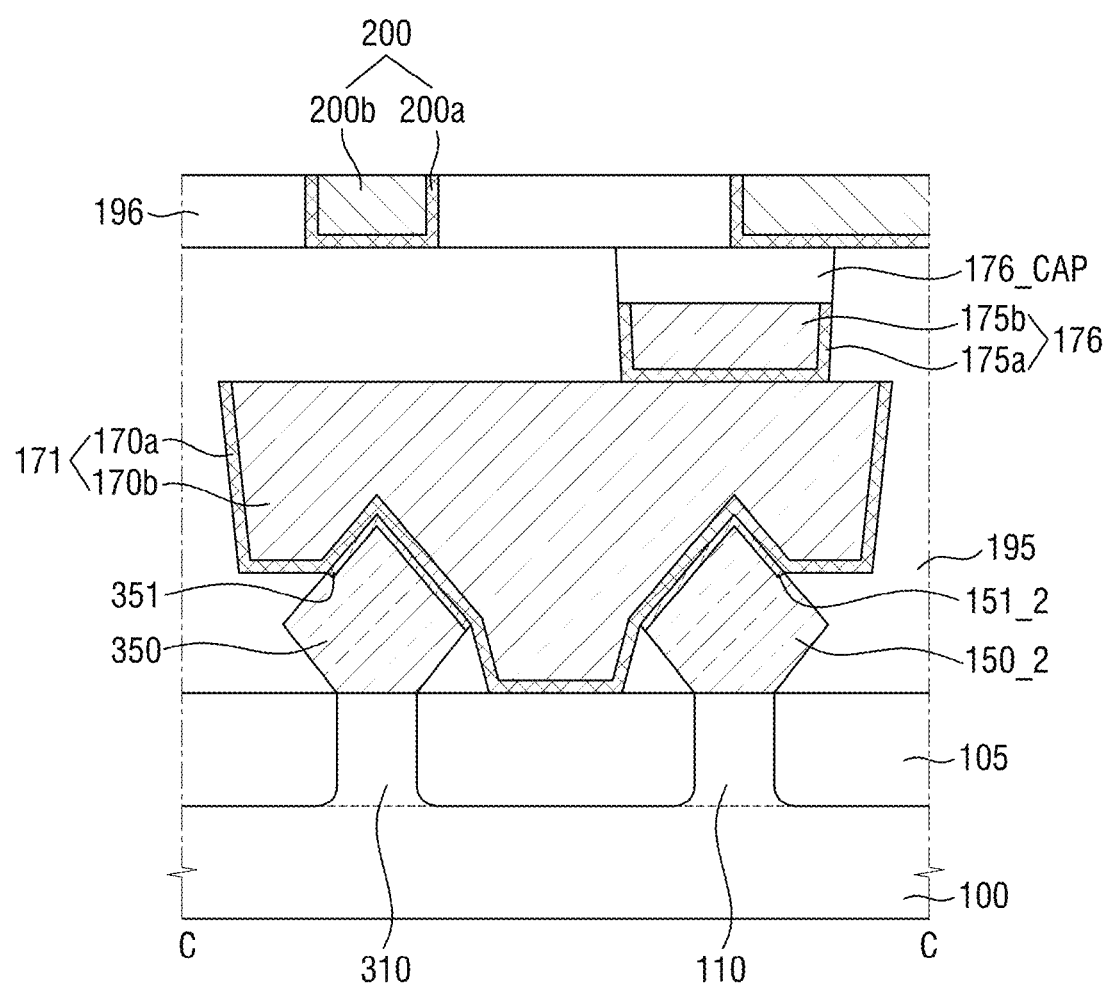
FIG. 15 is a diagram for explaining the semiconductor device according to some example embodiments.

FIG. 12 is a diagram for explaining the semiconductor device according to some example embodiments. FIG. 13 is a diagram for explaining the semiconductor device according to some example embodiments. FIG. 14 is a diagram for explaining the semiconductor device according to some example embodiments. FIG. 15 is a diagram for explaining the semiconductor device according to some example embodiments. For convenience of explanation, points different from those explained using FIGS. 1 to 5 will be mainly explained.

Referring to FIG. 12, in the semiconductor device according to some example embodiments, the first active pattern 110 and the second active pattern 210 may be separated by an active pattern separation structure ACS.

The active pattern separation structure ACS may be placed between the third gate structure G3 and the fourth gate structure G4. An upper surface of the active pattern structure ACS may be placed on the same level, e.g. the same plane as (e.g. coplanar) the upper surface 145us of the first gate capping pattern, the upper surface 176u_CAP of the first node capping pattern and the upper surface of the third node capping pattern 178_CAP.

The active pattern separation structure ACS may include, for example, at least one of silicon nitride, silicon oxide, silicon carbonitride, silicon oxycarbide, silicon oxynitride and silicon oxycarbonitride. Although the active pattern separation structure ACS is shown as a single film, this is only for convenience of explanation, and the embodiment is not limited thereto.

Referring to FIG. 13, in the semiconductor device according to some example embodiments, the second gate insulating film 230 and the third gate insulating film 330 may extend along the side walls of the gate separation pattern GCS.

The second gate electrode 220 and third gate electrode 320 may not be in contact with the gate separation pattern GCS.

Referring to FIG. 14, in the semiconductor device according to some example embodiments, a part of the first interlayer insulating film 195 may be interposed between the short side of the second gate structure G2 and the short side of the third gate structure G3.

A second gate spacer 240 may be placed on the side wall including the short side of the second gate electrode 220. A third gate spacer 340 may be placed on the side wall including the short side of the third gate electrode 320.

Referring to FIG. 15, in the semiconductor device according to some example embodiments, the first bridge contact 171 passes between the first epitaxial pattern 150_2 and the third epitaxial pattern 350 and may extend to the upper surface of the field insulating film 105.

For example, the bottom surface of the first bridge contact 171 may be in contact with the field insulating film 105.

Figure 16:
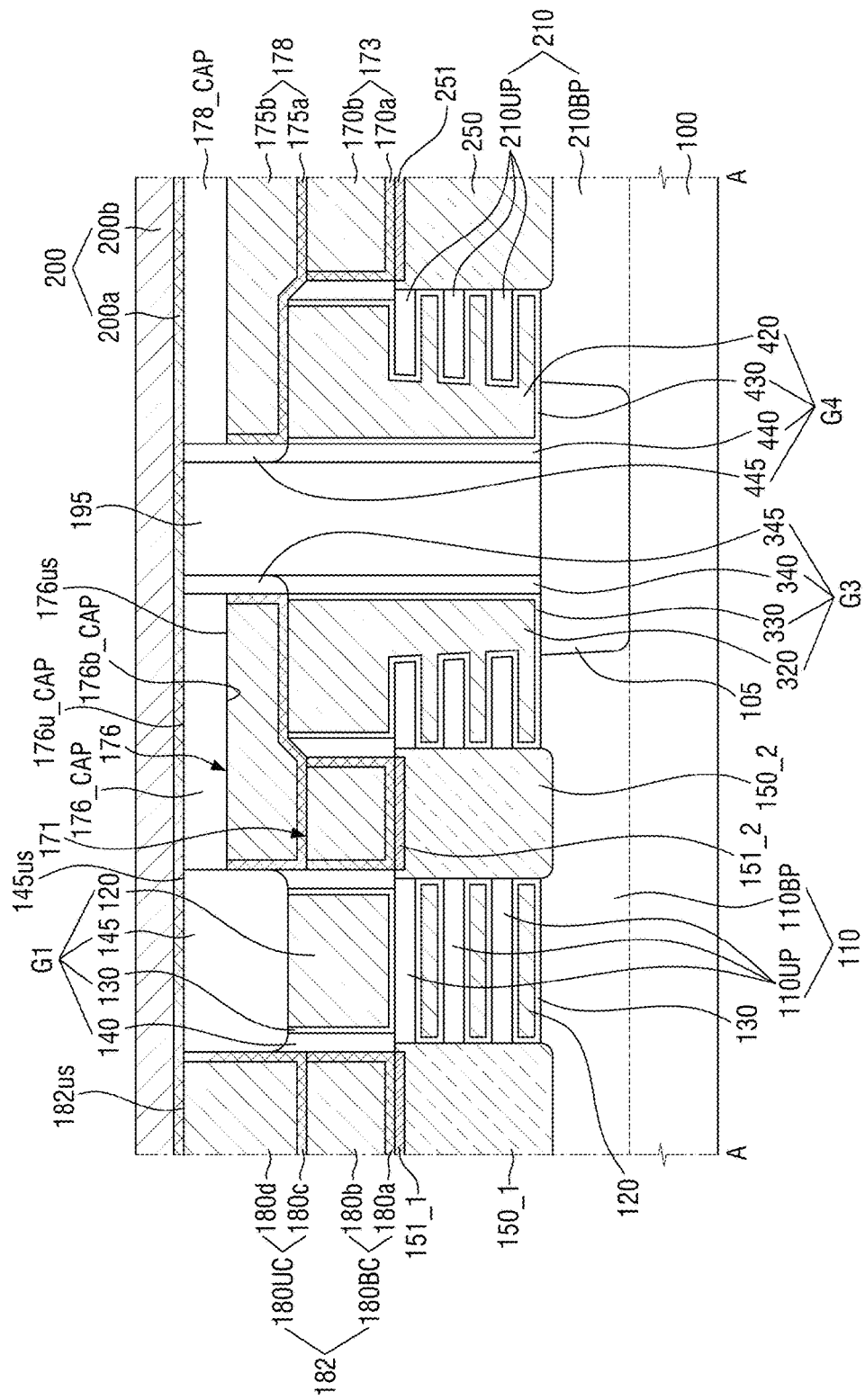
FIGS. 16 and 17 are diagrams for explaining the semiconductor device according to some example embodiments.
Figure 17:
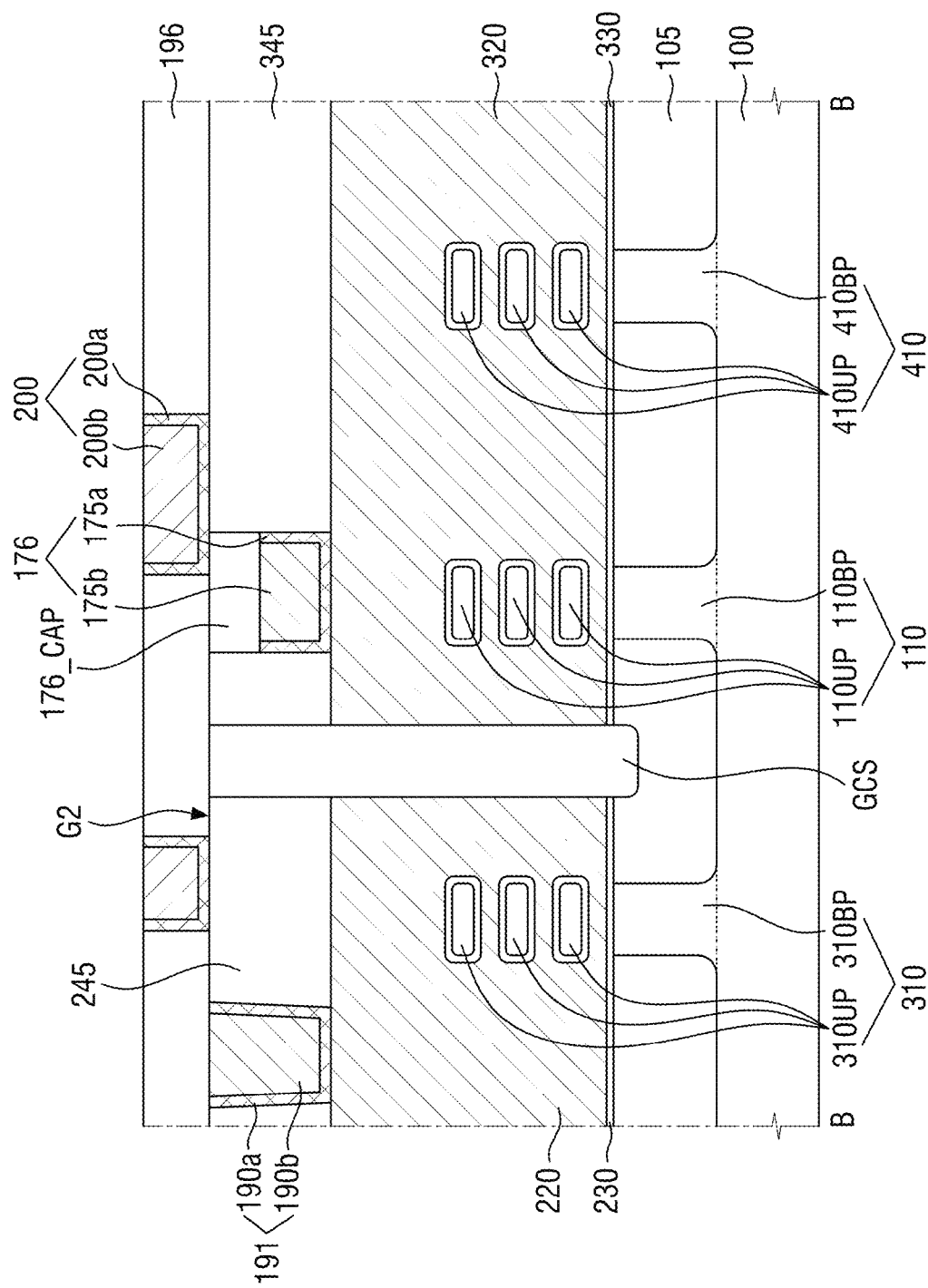

FIGS. 16 and 17 are diagrams for explaining the semiconductor device according to some example embodiments. For convenience of explanation, points different from those explained using FIGS. 1 to 5 will be mainly explained.

Referring to FIGS. 2, 16 and 17, in the semiconductor device according to some example embodiments, the active patterns 110, 210, 310, and 410 may include lower active patterns 110BP, 210BP, 310BP, and 410BP, and nanosheets 110UP, 210UP, 310UP, and 410UP.

The lower active patterns 110BP, 210BP, 310BP, and 410BP may each extend long in the first direction D1. The first lower active pattern 110BP may be spaced apart from the second lower active pattern 210BP in the first direction D1. A field insulating film 105 may be placed between the first lower active pattern 110BP and the second lower active pattern 210BP. The first lower active pattern 110BP, the third lower active pattern 310BP and the fourth lower active pattern 410BP may be spaced apart from each other in the second direction D2.

A first nanosheet 110UP may be placed on the first lower active pattern 110BP, to be spaced apart from the first lower active pattern 110BP. The first nanosheet 110UP may include a plurality of sheet patterns. Although three first nanosheets 110UP are shown, this is only for convenience of explanation, and example embodiments are not limited thereto. Explanation of the second to fourth nanosheets 210UP, 310UP, and 410UP may be similar to explanation of the first nanosheet 110UP. Although not shown, the fifth active pattern (510 of FIG. 2) may also include a lower active pattern and nanosheet.

For example, the first nanosheet 110UP between the first epitaxial pattern 150_1 and the first epitaxial pattern 150_2 adjacent to each other in the second direction D2 may be a channel pattern used as the channel region of the transistor. Similarly, second to fourth nanosheets 210UP, 310UP, and 410UP placed between adjacent epitaxial patterns may also be used as the channel region of the transistor.

In FIG. 16, the third gate structure G3 placed at the end portion of the first active pattern 110 may wrap the first nanosheet 110UP placed near the end of the first lower active pattern 110BP. The fourth gate structure G4 placed at the end portion of the second active pattern 210 may wrap the second nanosheet 210UP placed near the end of the second lower active pattern 210BP.

The third gate electrode 320 may wrap the first nanosheet 110UP placed near the end of the first lower active pattern 110BP. The fourth gate electrode 420 may wrap a second nanosheet 210UP placed near the end of the second lower active pattern 210BP.

In FIG. 17, the second gate electrode 220 may wrap the periphery of the third nanosheet 310UP on the third lower active pattern 310BP. Further, the third gate electrode 320 may wrap the periphery of the first nanosheet 110UP on the first lower active pattern 110BP and the periphery of the fourth nanosheet 410UP on the fourth lower active pattern 410BP.

Also, the gate insulating films 130, 230, 330, and 430 may be formed along the peripheries of the nanosheets 110UP, 210UP, 310UP, and 410UP.

Gate electrodes 120, 220, 320, and 420 and gate insulating films 130, 230, 330, and 430 may be interposed between the nanosheets 110UP, 210UP, 310UP, and 410UP adjacent to each other in the thickness direction of the substrate 100.

The first gate insulating film 130 and the third gate insulating film 330 may be in contact with the first epitaxial patterns 150_1 and 150_2. The fourth gate insulating film 430 may be in contact with the second epitaxial pattern 250.

Unlike the shown case, an inner spacer may be placed between the first epitaxial patterns 150_1 and 150_2 and the first gate insulating film 130, between the first epitaxial pattern 150_2 and the third gate insulating film 330, and between the second epitaxial pattern 250 and the fourth gate insulating film 430. The inner spacer may include an insulating material.

For example, although the inner spacer may not be formed in a PMOS region of SRAM and the inner spacer may be formed in a NMOS region of SRAM, the embodiment is not limited thereto.

Figure 18:
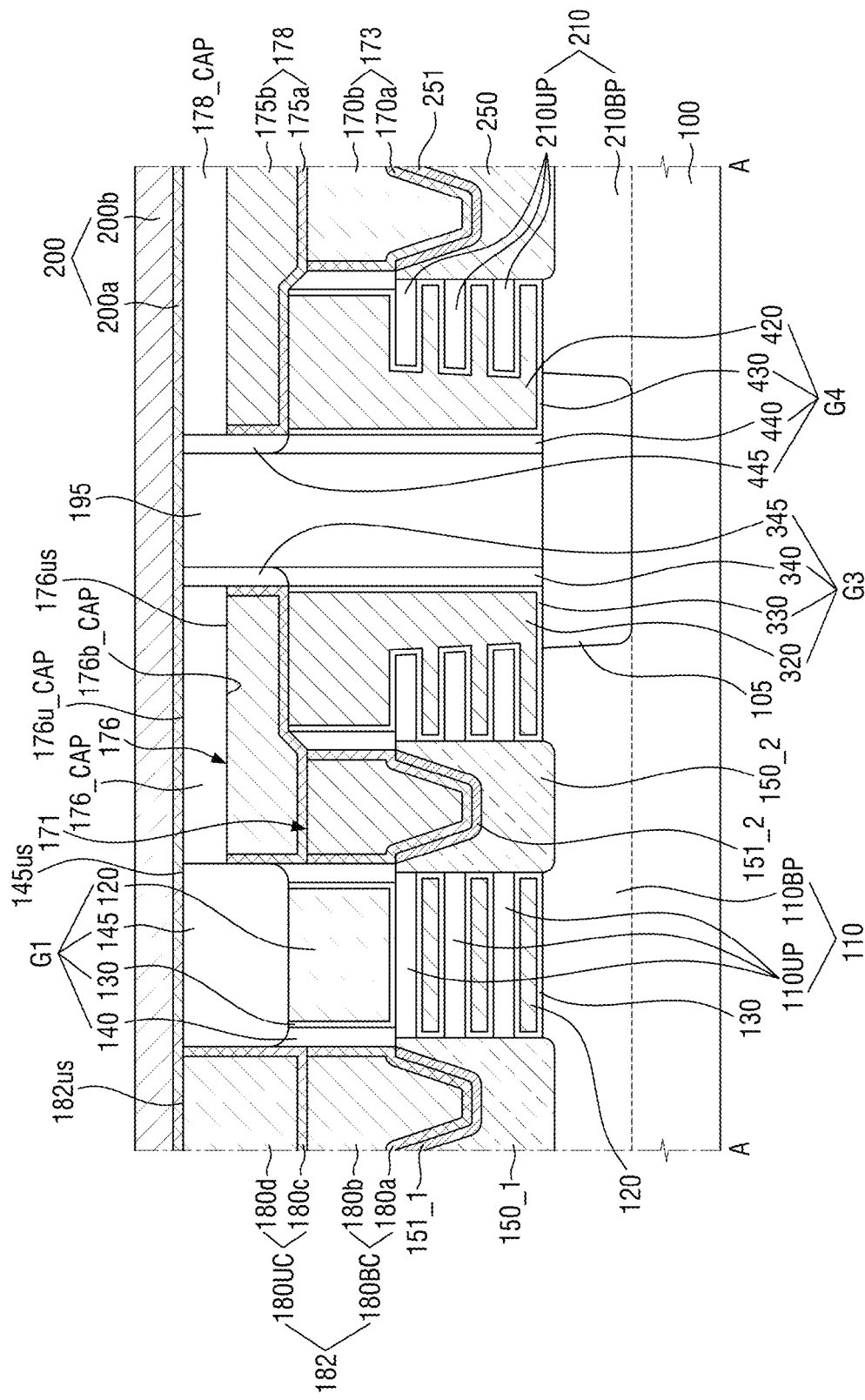
FIG. 18 is a diagram for explaining the semiconductor device according to some example embodiments.

FIG. 18 is a diagram for explaining the semiconductor device according to some example embodiments. For convenience of explanation, points different from those explained using FIGS. 16 and 17 will be mainly explained.

Referring to FIG. 18, in the semiconductor device according to some example embodiments, a part of the second source/drain contact 182 may be inserted into the first epitaxial pattern 150_1. A part of the first bridge contact 171 and a part of the third bridge contact 173 may be inserted into the first epitaxial pattern 150_2 and the second epitaxial pattern 250.

The first silicide film 151_1, the first silicide film 151_2 and the second silicide film 251 may be formed along the profiles of the contacts 182, 171, and 173 inserted into the epitaxial patterns 150_1 and 150_2, and 250.

FIGS. 19 to 31 are intermediate stage diagrams for explaining the method for fabricating the semiconductor device according to some example embodiments. For reference, FIGS. 19 and 22 may be layout views. FIGS. 20 and 21 are cross-sectional views taken along A-A and C-C of FIG. 19. FIGS. 23 and 24 are cross-sectional views taken along A-A and B-B of FIG. 22.

Figure 19:
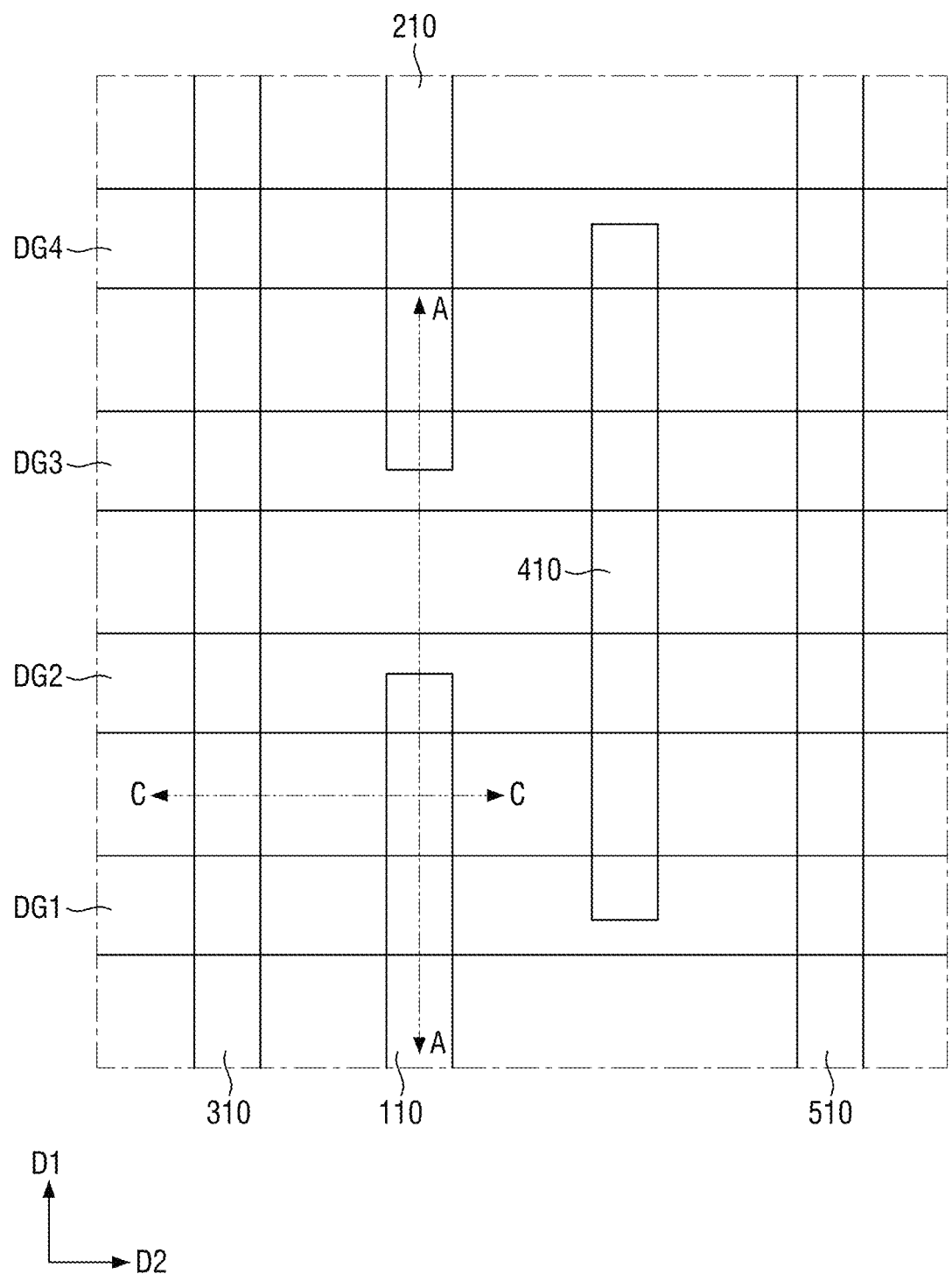
FIGS. 19 to 31 are intermediate stage diagrams for explaining a method for fabricating the semiconductor device according to some example embodiments.
Figure 20:
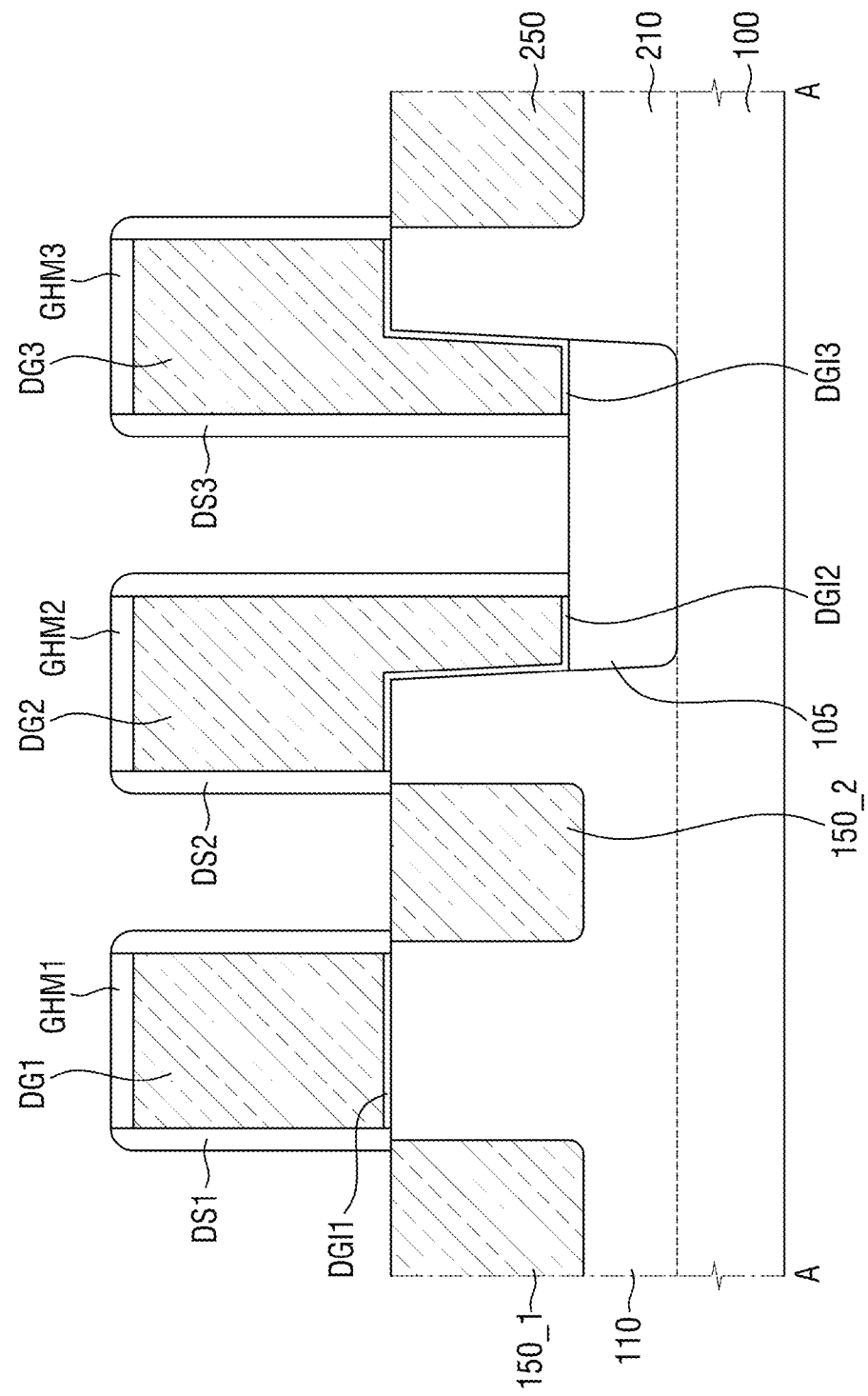
Figure 21:
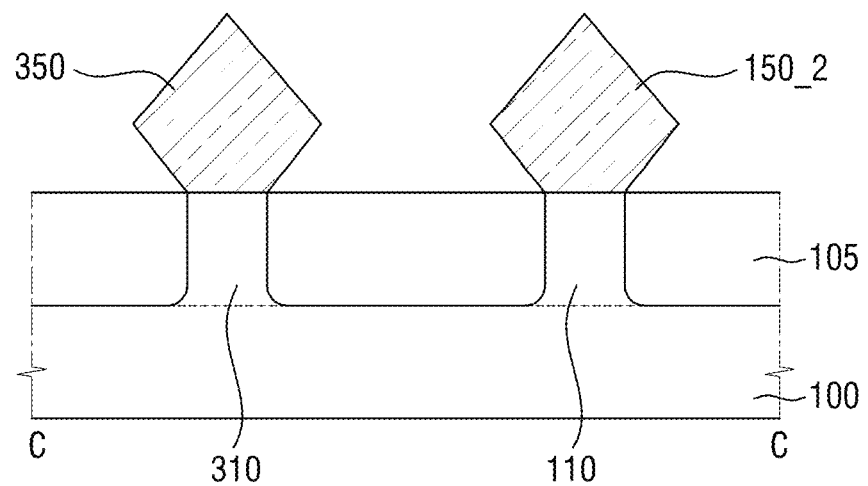

Referring to FIGS. 19 to 21, dummy gate electrodes DG1, DG2, DG3, and DG4 may be formed on the active patterns 110, 210, 310, 410, and 510 on the substrate 100.

The dummy gate electrodes DG1, DG2, DG3, and DG4 may each extend long in the second direction D2. The dummy gate electrodes DG1, DG2, DG3, and DG4 may be spaced apart from each other in the first direction D1.

A first dummy gate electrode DG1 and a second dummy gate electrode DG2 may intersect the first active pattern 110, the third active pattern 310, the fourth active pattern 410, and the fifth active pattern 510. The third dummy gate electrode DG3 and the fourth dummy gate electrode DG4 may intersect the second to fifth active patterns 210, 310, 410, and 510.

For example, a first gate hard mask GHM1 may be formed, e.g. formed with a CVD process, on the upper surface of the first dummy gate electrode DG1. A first dummy gate insulating film DGI1 may be placed, e.g. deposited and/or grown, on a bottom surface of the first dummy gate electrode DG1. A first dummy spacer DS1 may be placed, e.g. placed conformally, on the side walls of the first dummy gate electrode DG1. A second gate hard mask GHM2 may be formed, e.g. formed with a CVD process, on the upper surface of the second dummy gate electrode DG2. A second dummy gate insulating film DGI2 may be placed, e.g. deposited and/or grown, on the bottom surface of the second dummy gate electrode DG2. A second dummy spacer DS2 may be placed, e.g. placed conformally, on the side walls of the second dummy gate electrode DG2. A third gate hard mask GHM3 may be formed, e.g. formed with a CVD process, on the upper surface of the third dummy gate electrode DG3. A third dummy gate insulating film DGI3 may be placed, e.g. deposited and/or grown, on the bottom surface of the third dummy gate electrode DG3. A third dummy spacer DS3 may be placed, e.g. placed conformally, on the side walls of the third dummy gate electrode DG3.

An epitaxial pattern may be formed, e.g. grown, on the active patterns 110, 210, 310, 410, and 510 between the dummy gate electrodes DG1, DG2, DG3, and DG4 adjacent to each other in the first direction D1.

For example, the first epitaxial patterns 150_1 and 150_2 may be formed on the first active pattern 110. The second epitaxial pattern 250 may be formed on the second active pattern 210, and the third epitaxial pattern 350 may be formed on the third active pattern 310.

Figure 22:
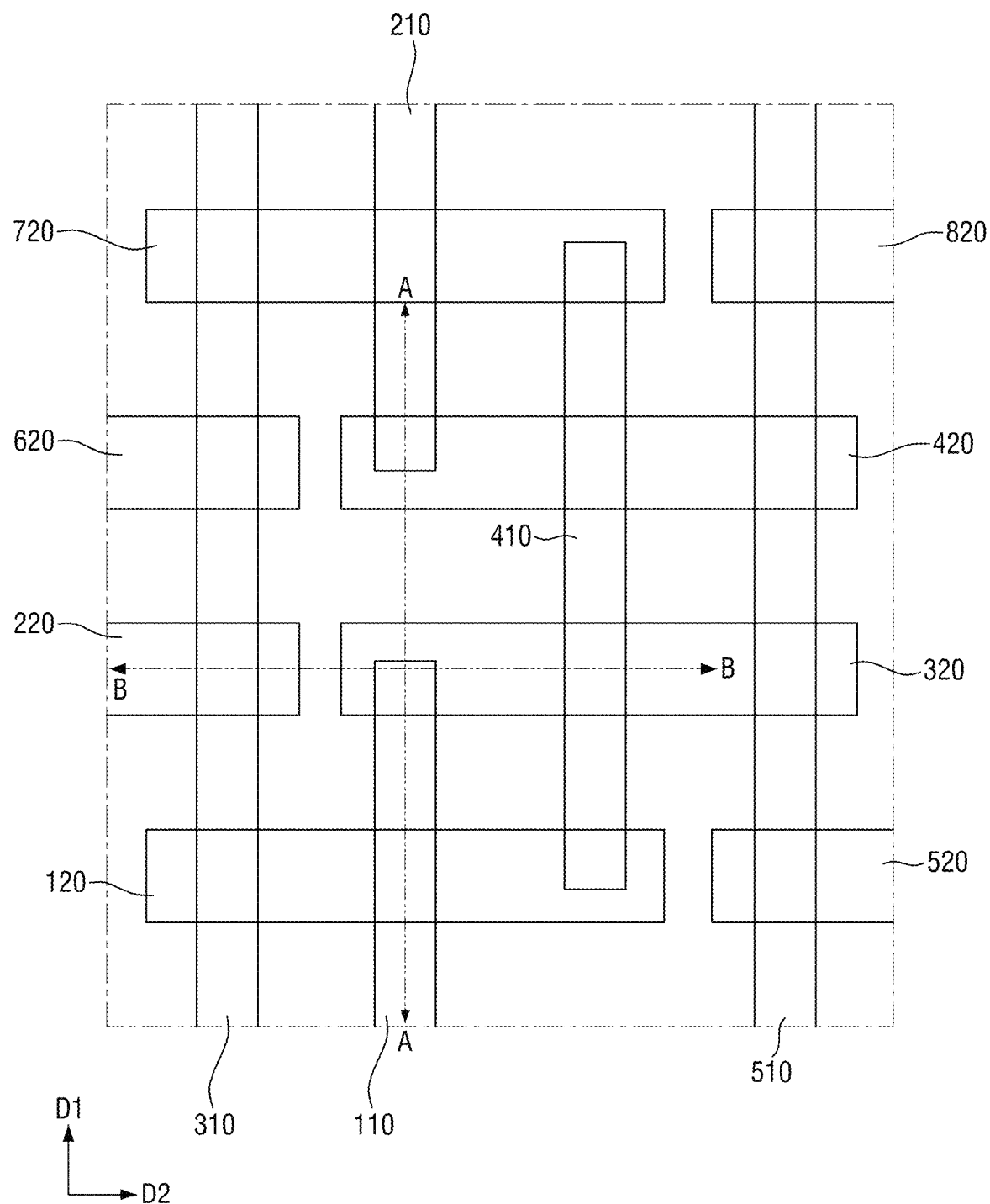
Figure 23:
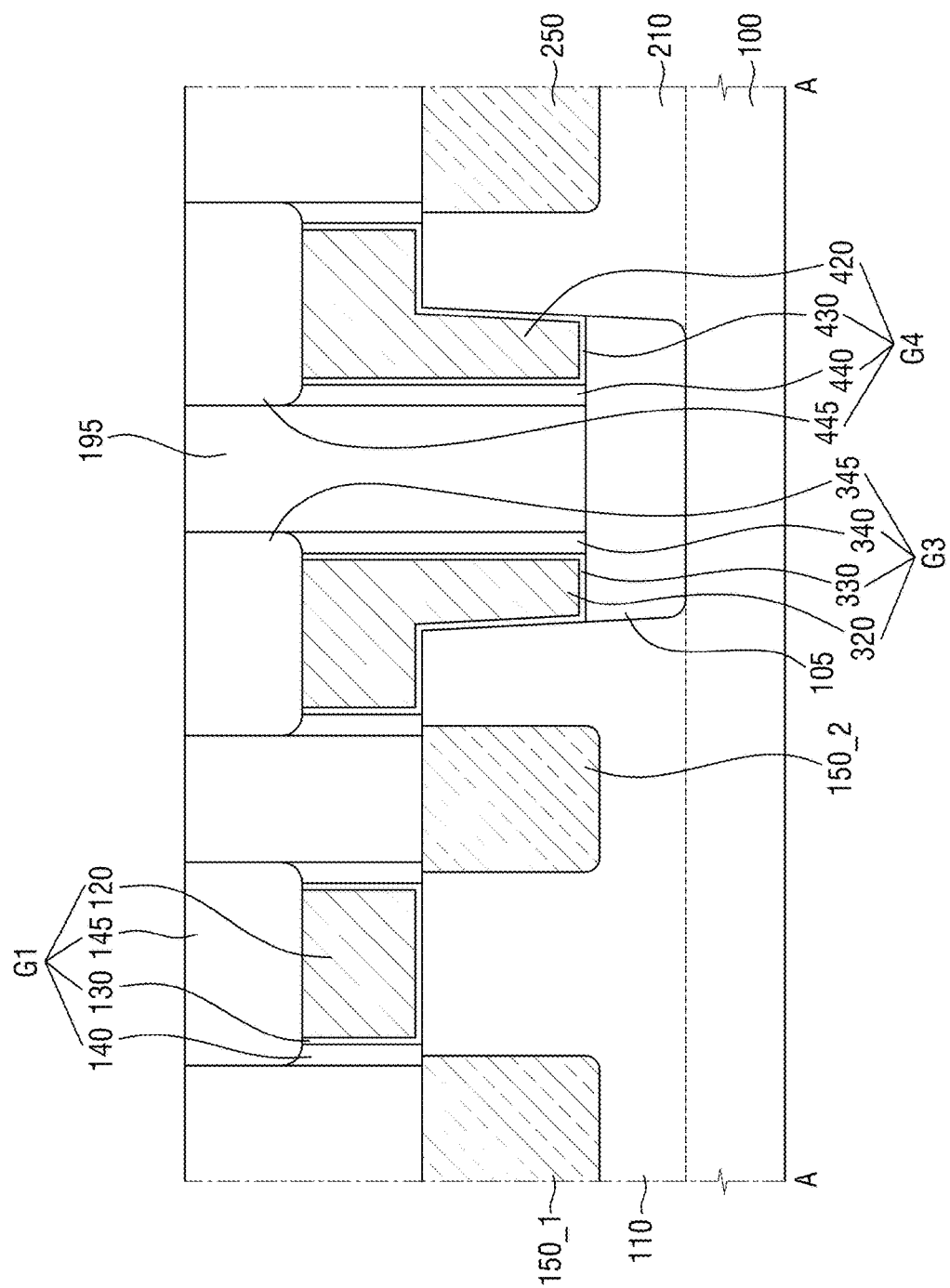
Figure 24:
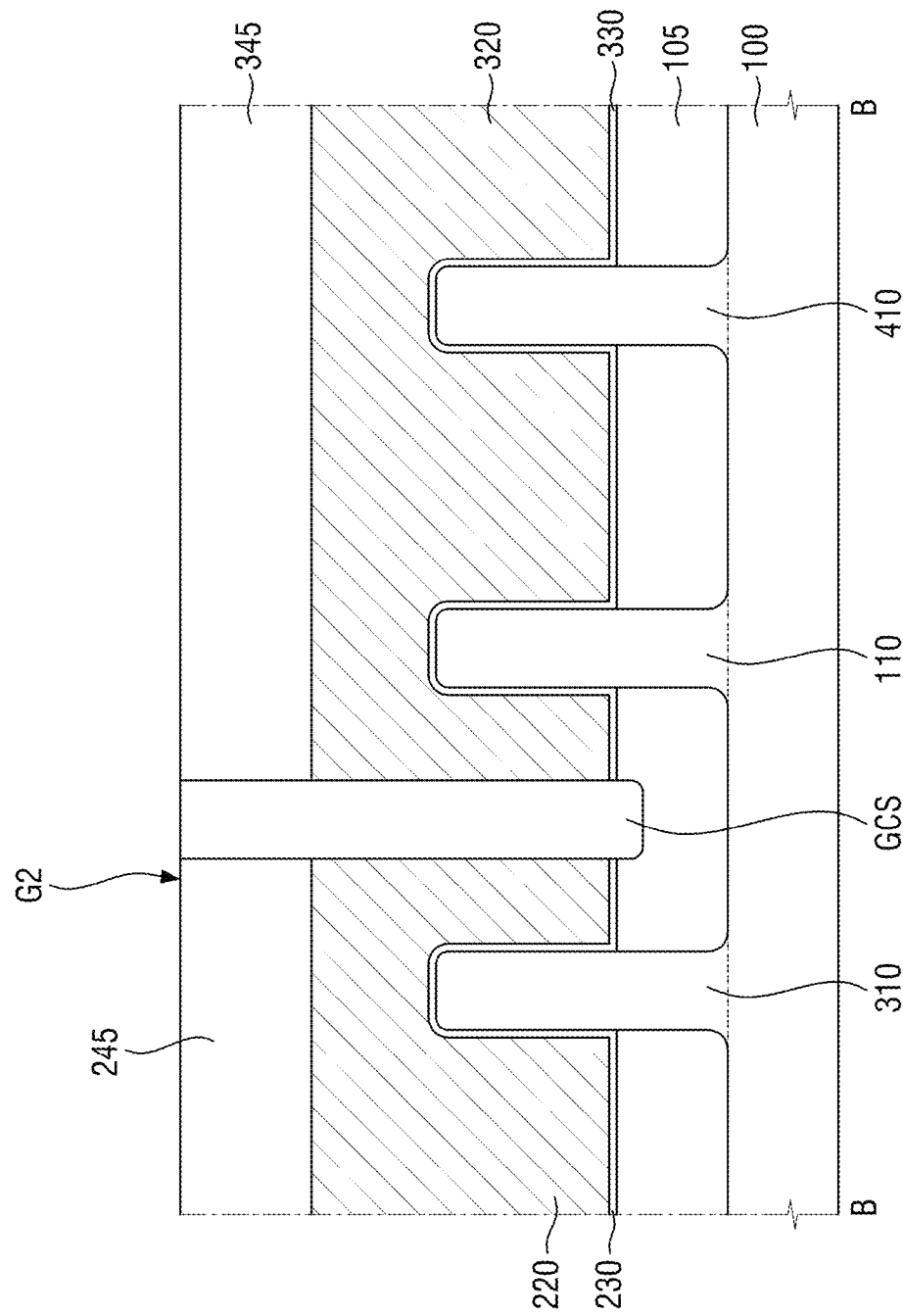

Referring to FIGS. 22 to 24, the dummy gate electrodes DG1, DG2, DG3, and DG4 may be replaced with metallic gate electrodes, through a replacement metal gate (RMG) process.

Subsequently, the gate electrodes 120, 220, 320, 420, 520, 620, 720, and 820 may be formed, e.g. deposited with a CVD process, on the substrate 100, through a gate separation process of separating the metallic gate electrodes.

For example, the first gate structure G1 may be formed on the first active pattern 110, the third active pattern 310, and the fourth active pattern 410. The second gate structure G2 may be formed on the third active pattern 310. The third gate structure G3 may be formed on the first active pattern 110, the fourth active pattern 410 and the fifth active pattern 510. The fourth gate structure G4 may be formed on the second active pattern 210, the fourth active pattern 410 and the fifth active pattern 510.

A first interlayer insulating film 195 which wraps the side walls of the gate structures G1, G2, G3, and G4 may be formed, on the field insulating film 105.

The following explanation will be given using a cross-sectional view taken along A-A and C-C of FIG. 19.

Figure 25:
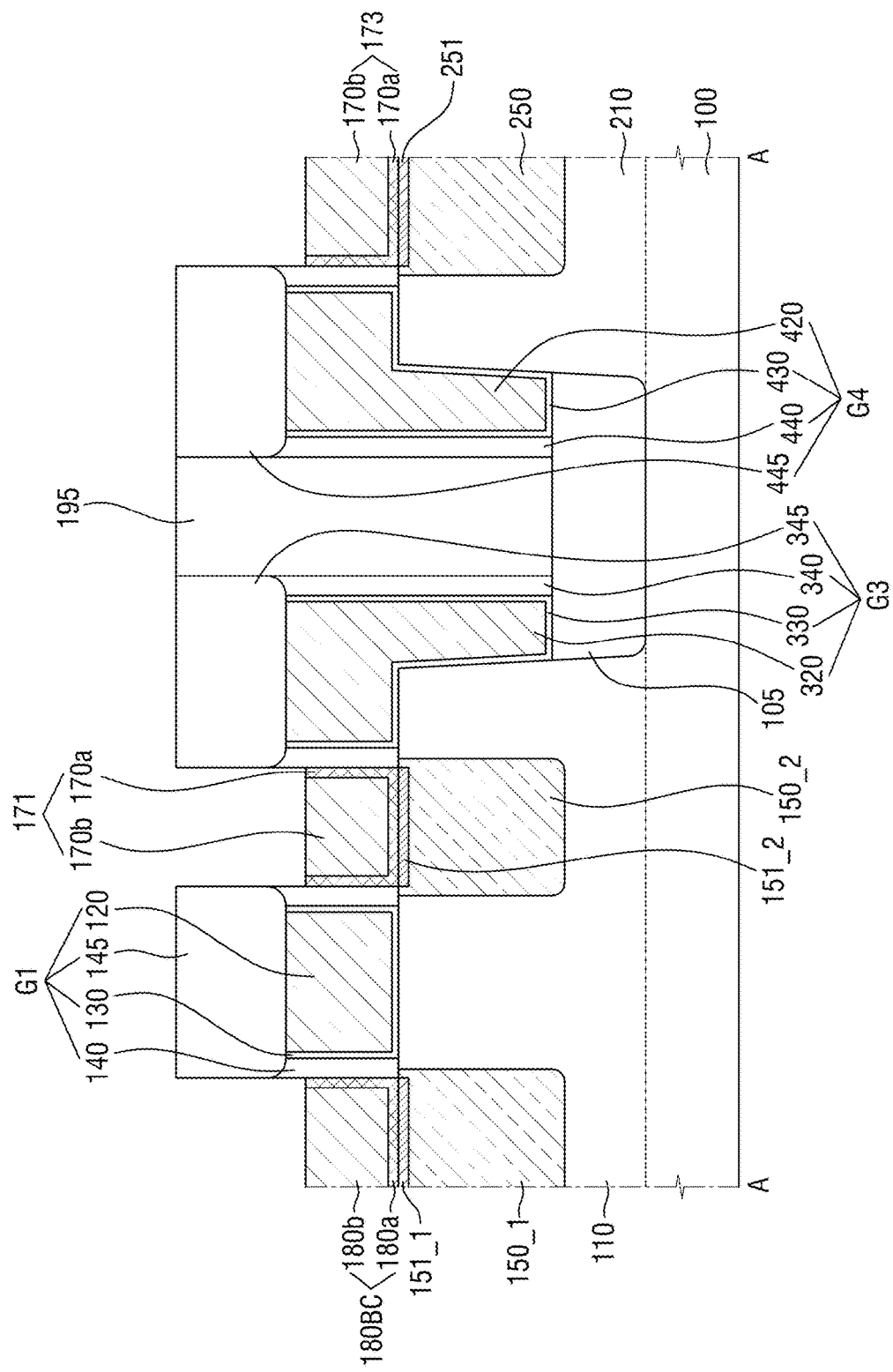
Figure 26:
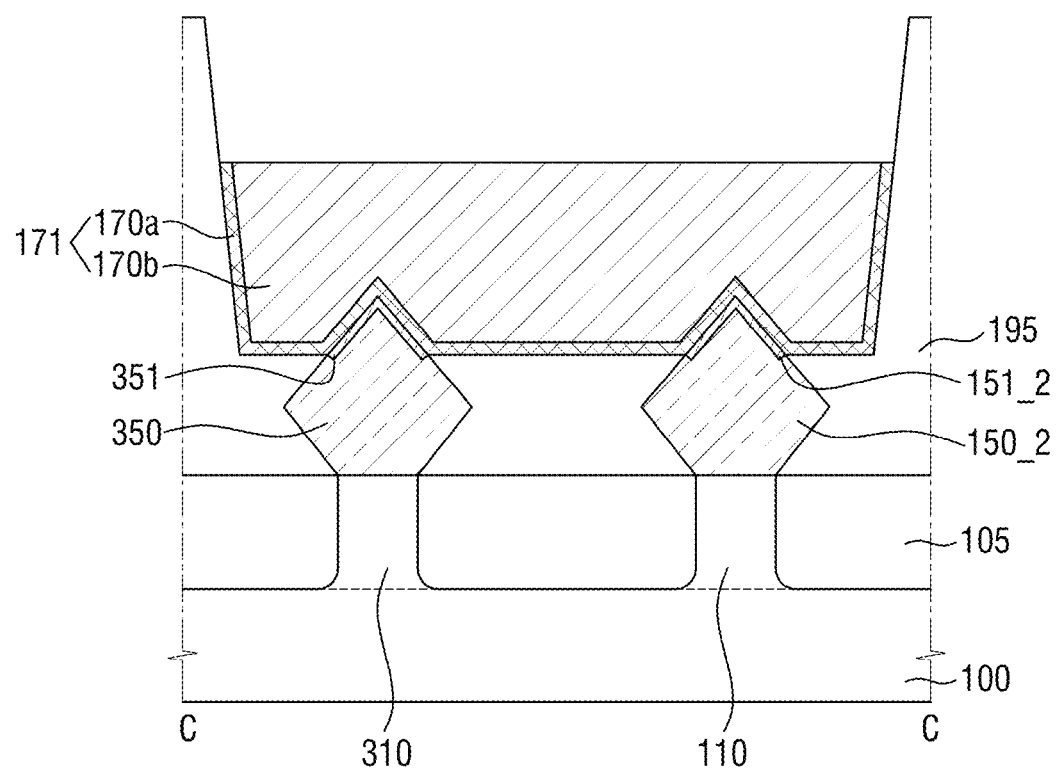

Referring to FIGS. 25 and 26, a first bridge contact 171 and a third bridge contact 173 may be formed in the first interlayer insulating film 195.

Further, a lower source/drain contact 180BC may be formed in the first interlayer insulating film 195. For example, the lower source/drain contact 180BC may be formed simultaneously with the first bridge contact 171 and the third bridge contact 173.

The first bridge contact 171 may be formed on the first epitaxial pattern 150_2 and the third epitaxial pattern 350. The third bridge contact 173 may be formed on the second epitaxial pattern 250. The lower source/drain contact 180BC may be formed on the first epitaxial pattern 150_1.

The upper surface of the first bridge contact 171, the upper surface of the third bridge contact 173, and the upper surface of the lower source/drain contact 180BC are lower than the upper surface of the first gate capping pattern 145.

Figure 27:
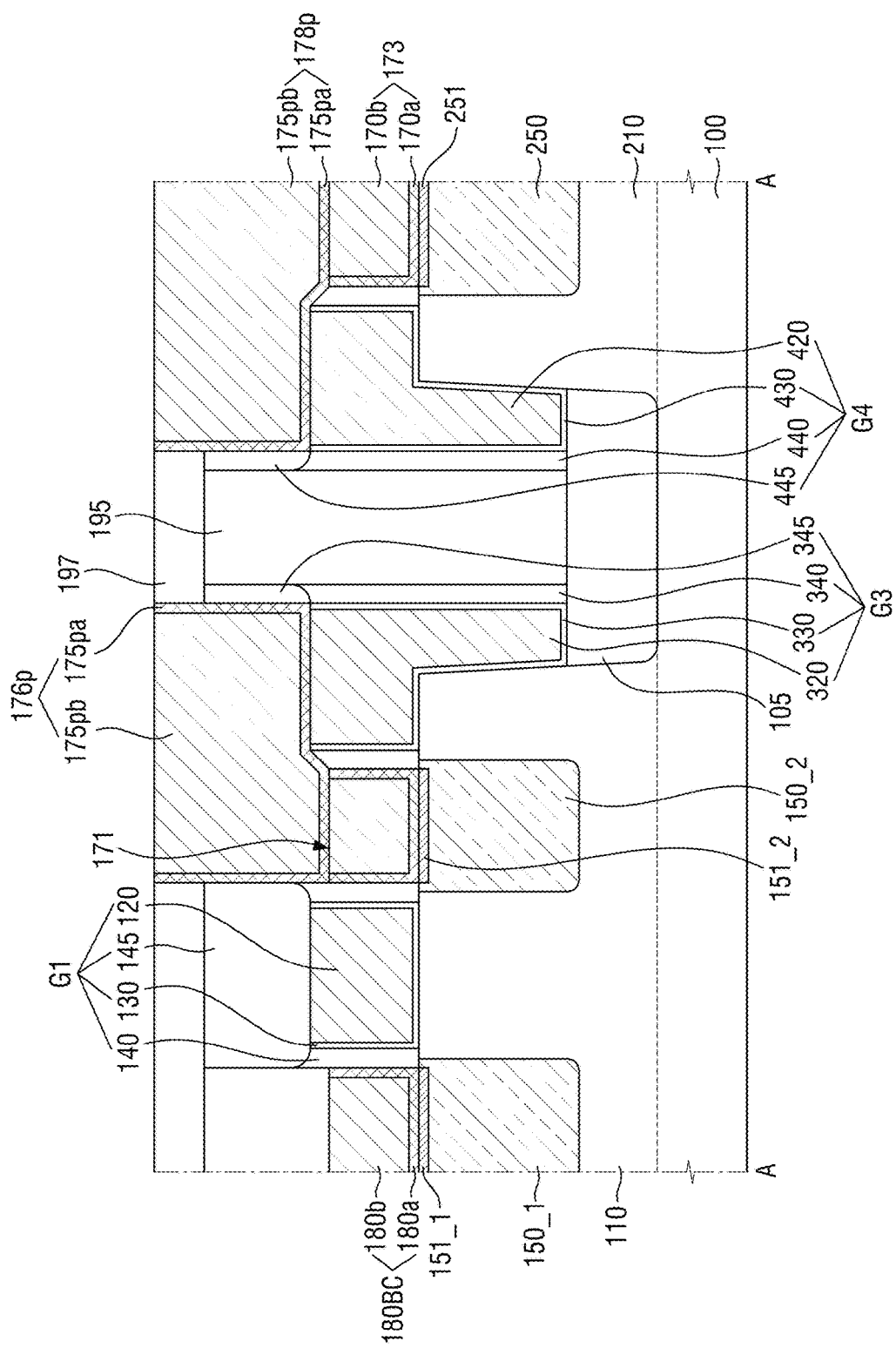
Figure 28:
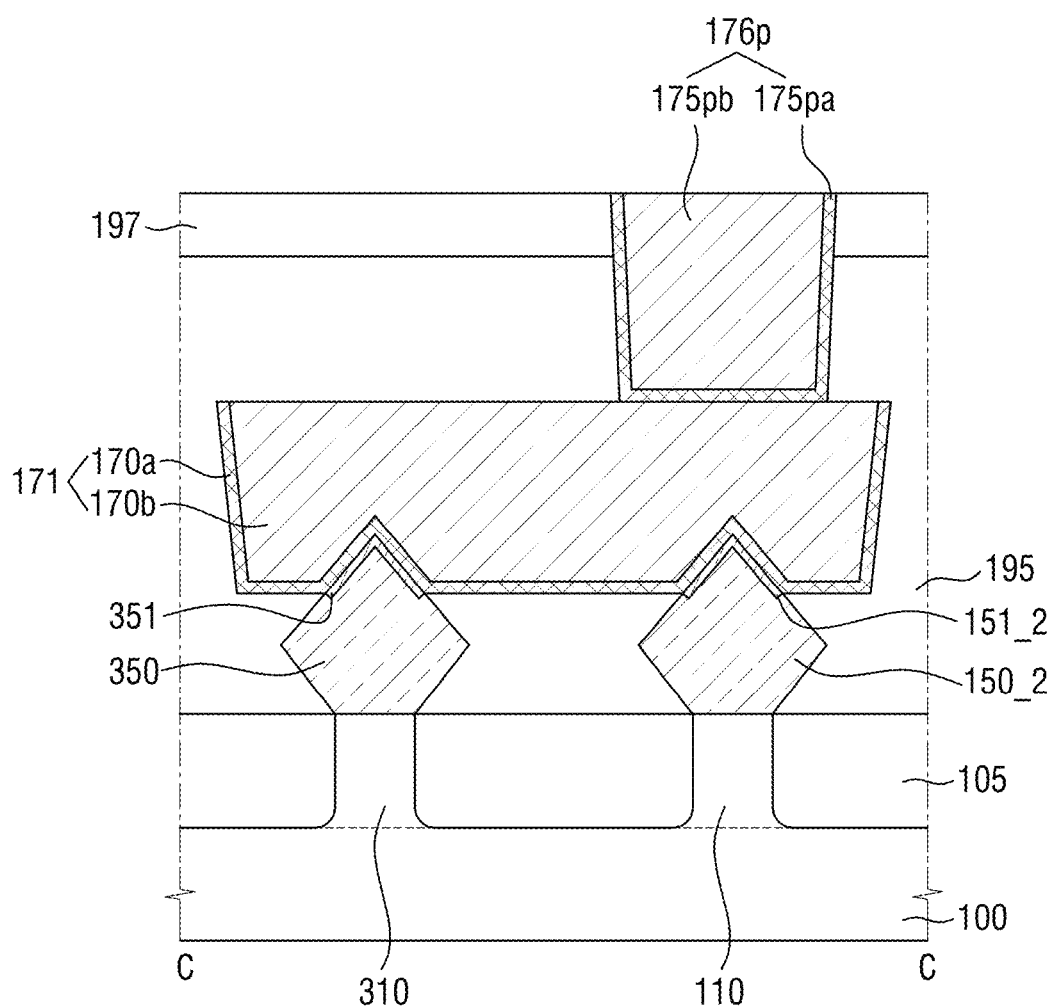

Referring to FIGS. 27 and 28, the first interlayer insulating film 195 and a third interlayer insulating film 197 which cover the first bridge contact 171, the third bridge contact 173, and the lower source/drain contact 180BC may be formed.

The third interlayer insulating film 197 may be formed on the upper surface of the first gate capping pattern 145.

Subsequently, a first pre node contact 176*p* may be formed on the first bridge contact 171 and the third gate electrode 320. A second pre node contact 178*p* may be formed on the third bridge contact 178 and the fourth gate electrode 420. An upper surface of the first pre node contact 176*p* and an upper surface of the second pre node contact 178*p* may be placed on the same level, e.g. the same plane as (e.g. coplanar) an upper surface of the third interlayer insulating film 197. In other words, the upper surface of the first pre node contact 176*p* and the upper surface of the second pre node contact 178*p* are higher than the upper surface of the first gate capping pattern 145. The first pre node contact 176*p* and the second pre node contact 178*p* may include a pre node barrier film 175*pa* and a pre node filling film 175*pb*.

More specifically, a first node contact hole that exposes the first bridge contact 171 and the third gate electrode 320, and a second node contact hole that exposes the third bridge contact 173 and the fourth gate electrode 420 may be formed in the third interlayer insulating film 197 and the first interlayer insulating film 195. The first pre node contact 176*p* may be formed in the first node contact hole. The second pre node contact 178*p* may be formed in the second node contact hole.

Figure 29:
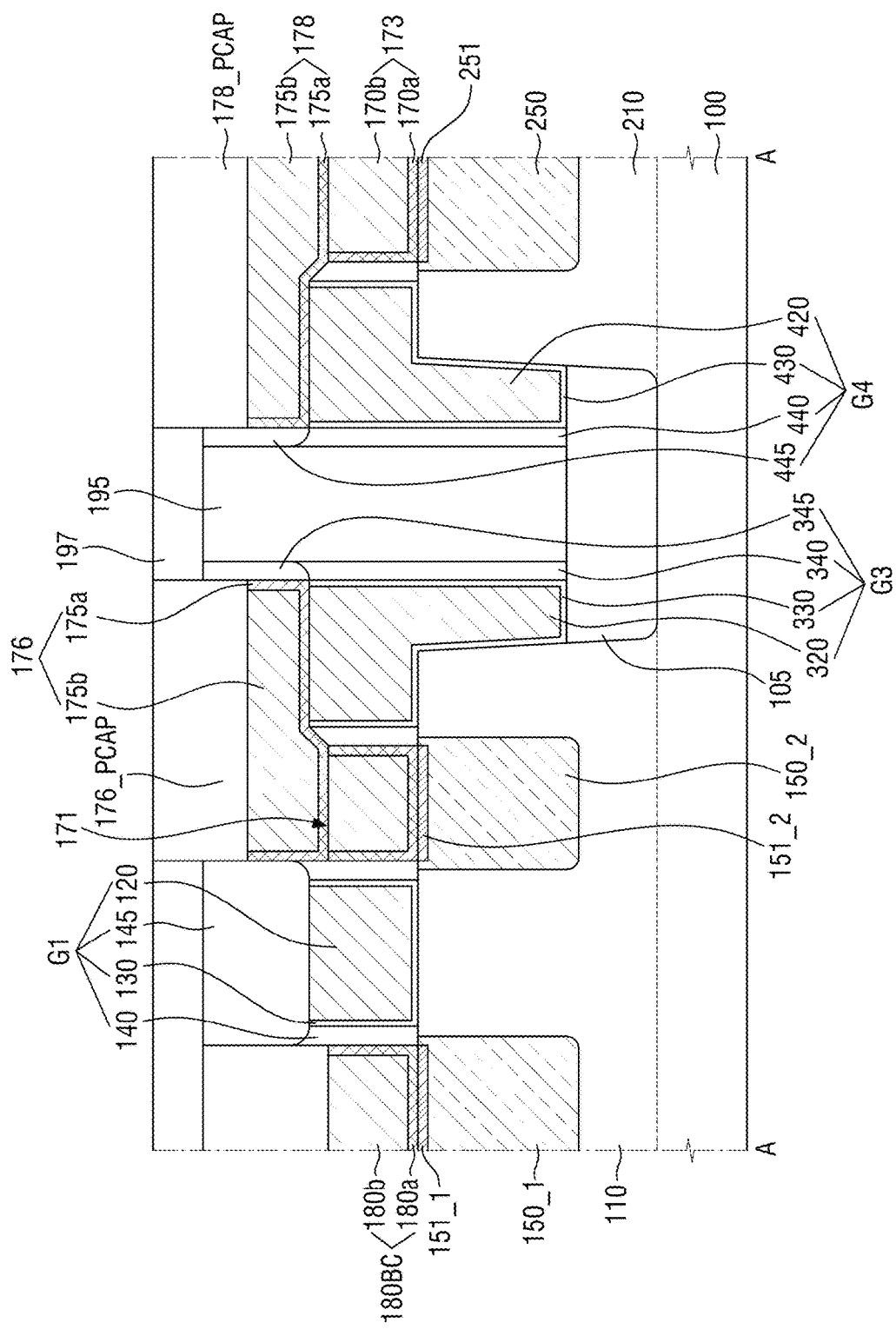
Figure 30:
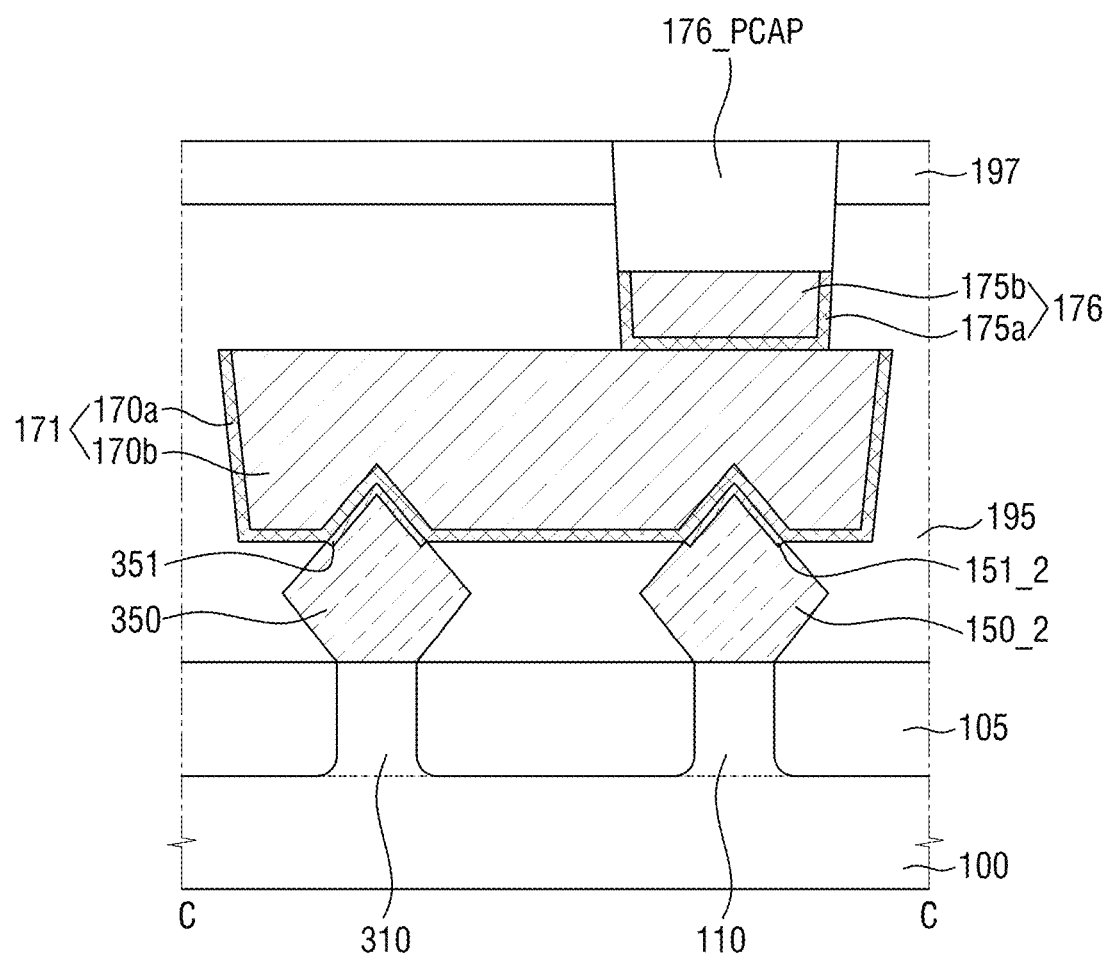

Referring to FIGS. 29 and 30, by partially removing the first pre node contact 176*p* and the second pre node contact 178*p*, the first node contact 176 and the third node contact 178 may be formed.

The upper surface of the first node contact 176 and the upper surface of the third node contact 178 are lower than the upper surface of the first gate capping pattern 145.

Subsequently, a first pre node capping pattern 176_PCAP and a second pre node capping pattern 178_PCAP may be formed in the space from which the first pre node contact 176p and the second pre node contact 178p are partially removed. The first pre node capping pattern 176_PCAP and the second pre node capping pattern 178_PCAP may be formed on the first node contact 176 and the third node contact 178. The upper surface of the first pre node capping pattern 176_PCAP and the upper surface of the second pre node capping pattern 178_PCAP may be placed on the same level, e.g. the same plane as (e.g. coplanar) the upper surface of the third interlayer insulating film 197.

Since the first pre node capping pattern 176_PCAP is formed in the space from which a part of the first pre node contact 176p is removed, the width of the lower surface of the first pre node capping pattern 176_PCAP may be the same as the width of the upper surface of the first node contact 176. Since the second pre node capping pattern 178_PCAP is formed in the space from which a part of the second pre node contact 178p is removed, the width of the lower surface of the second pre node capping pattern 178_PCAP may be the same as the width of the upper surface of the third node contact 178.

Figure 31:
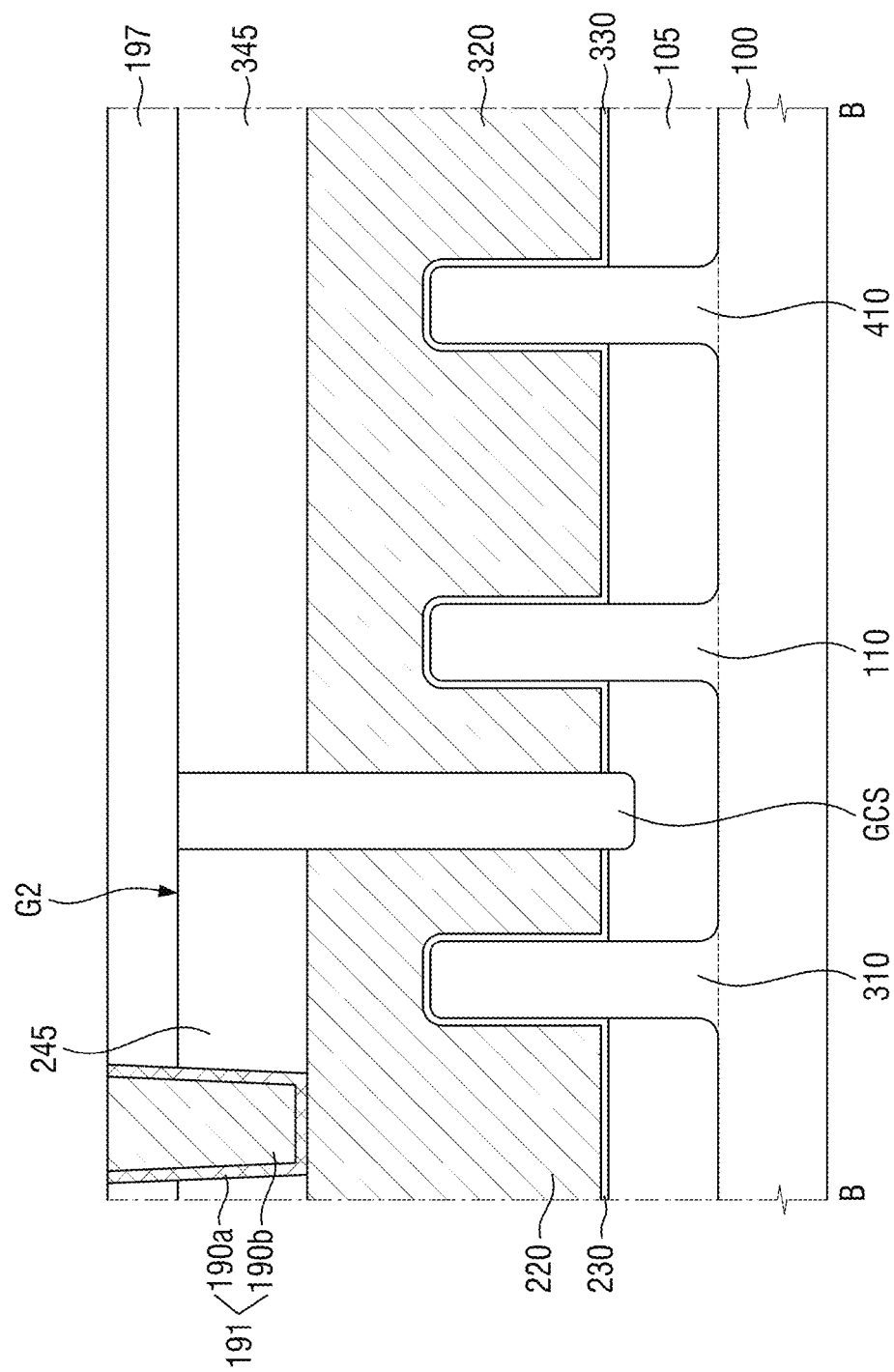

Referring to FIG. 31, after forming the first pre node capping pattern 176_PCAP and the second pre node capping pattern 178_PCAP, a pre gate contact 191p connected to the second gate electrode 220 is formed on the second gate electrode 220.

The upper surface of the pre gate contact 191p may be placed on the same level, e.g. the same plane as (e.g. coplanar) the upper surface of the third interlayer insulating film 197. The pre gate contact 191p may include a pre gate contact barrier film 190pa and a pre gate contact filling film 190pb.

Subsequently, by removing a part of the pre gate contact 191p, a part of the first pre node capping pattern 176_PCAP, a part of the second pre node capping pattern 178_PCAP, and the third interlayer insulating film 197, a first gate contact (190 of FIG. 4), a first node capping pattern (176_CAP of FIG. 3), and a third node capping pattern (178_CAP of FIG. 3) may be formed.

Subsequently, an upper source/drain contact (180UC of FIG. 3) may be formed on the lower source/drain contact 180BC. A second source/drain contact (182 of FIG. 3) may be formed on the first epitaxial pattern 150_1 accordingly. Subsequently, a wiring pattern (200 of FIG. 3) may be formed.

Unlike the shown case, in FIG. 25, an upper source/drain contact (180UC of FIG. 3) may be formed on the lower source/drain contact 180BC.

FIGS. 32 to 40 are intermediate stage diagrams for explaining a method for fabricating the semiconductor device according to some example embodiments. For reference, FIGS. 32 to 34 may be steps performed after FIGS. 25 and 26.

Figure 32:
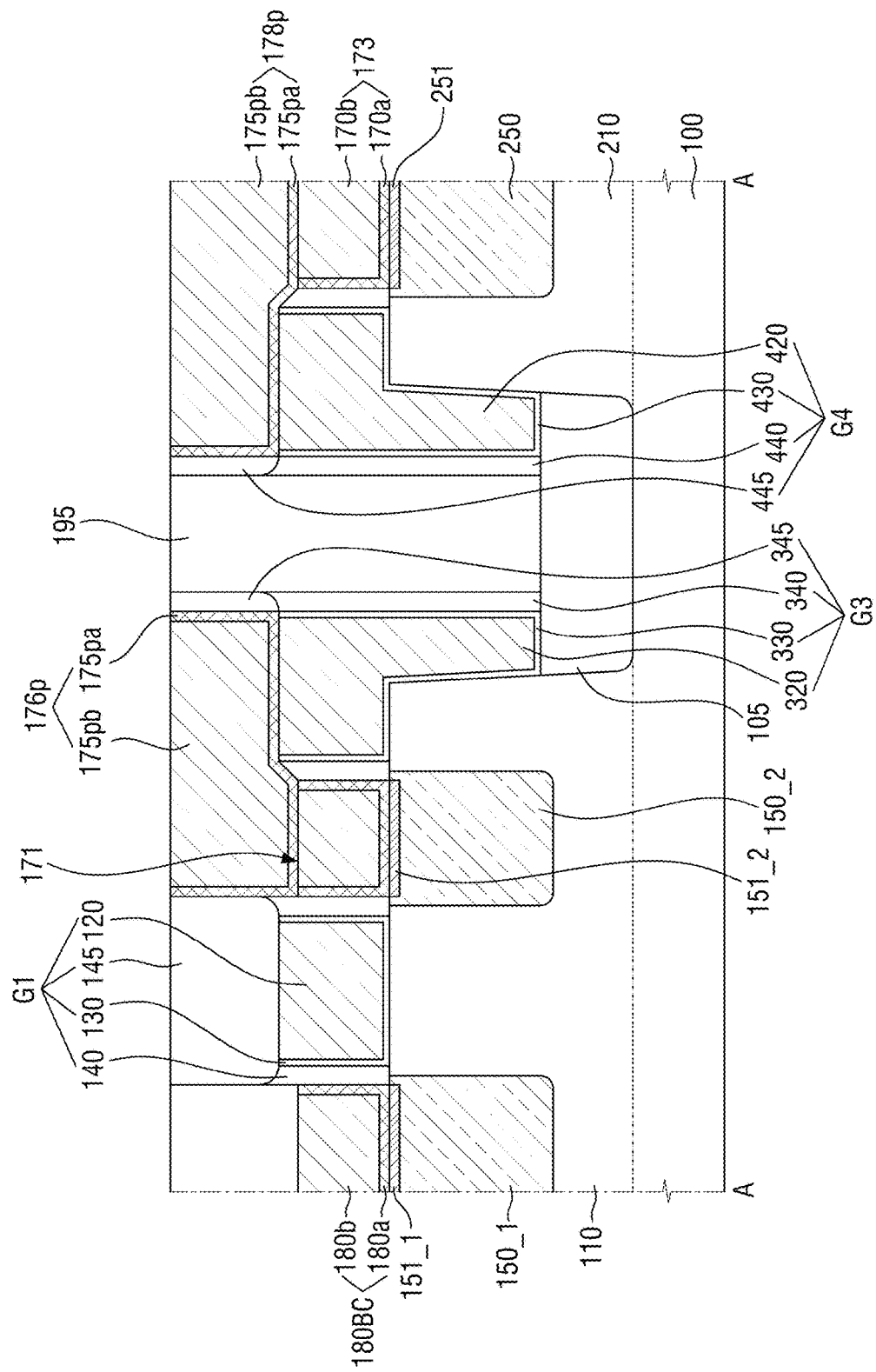
FIGS. 32 to 40 are intermediate stage diagrams for explaining the method for fabricating the semiconductor device according to some example embodiments.
Figure 33:
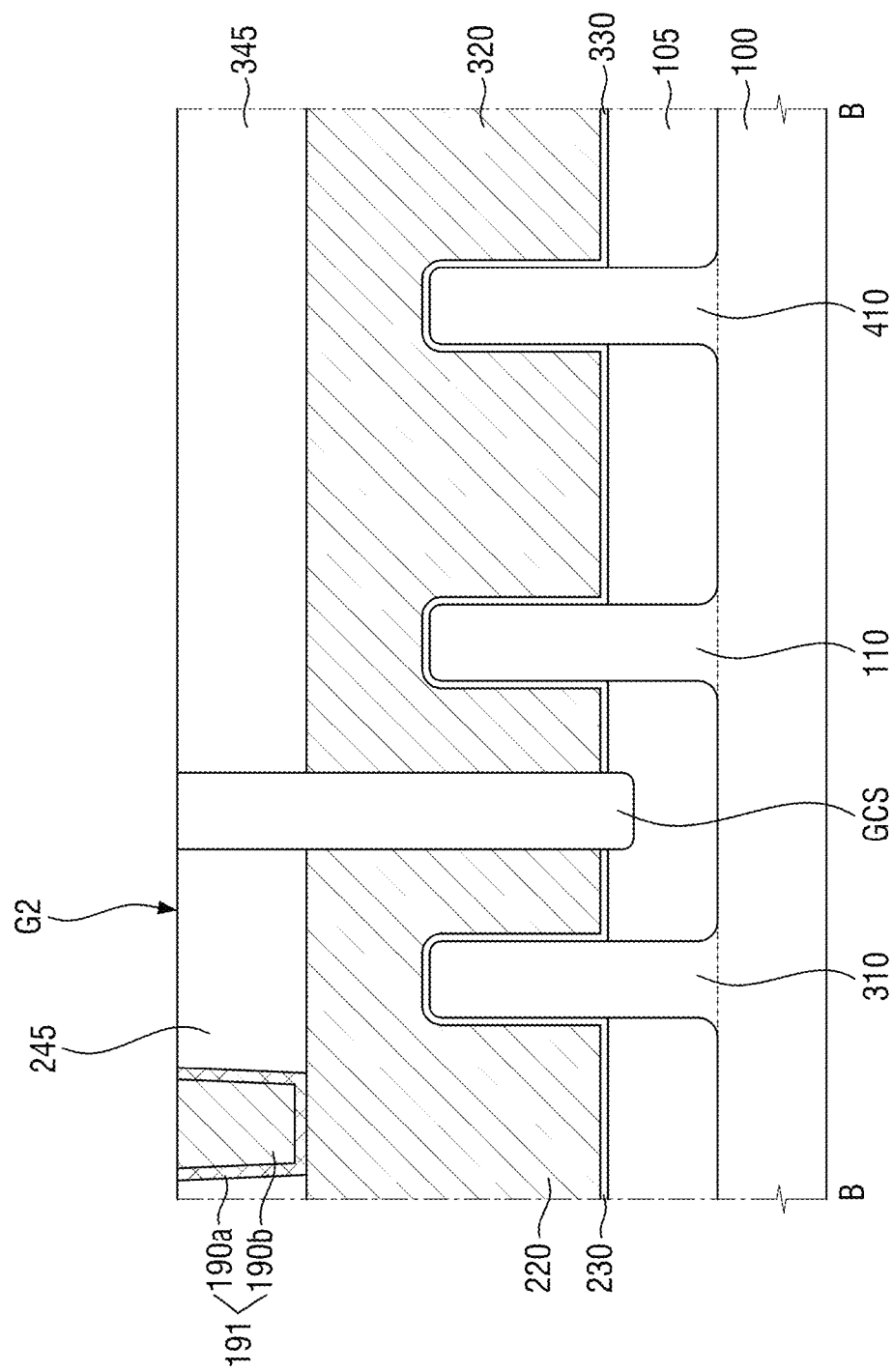
Figure 34:
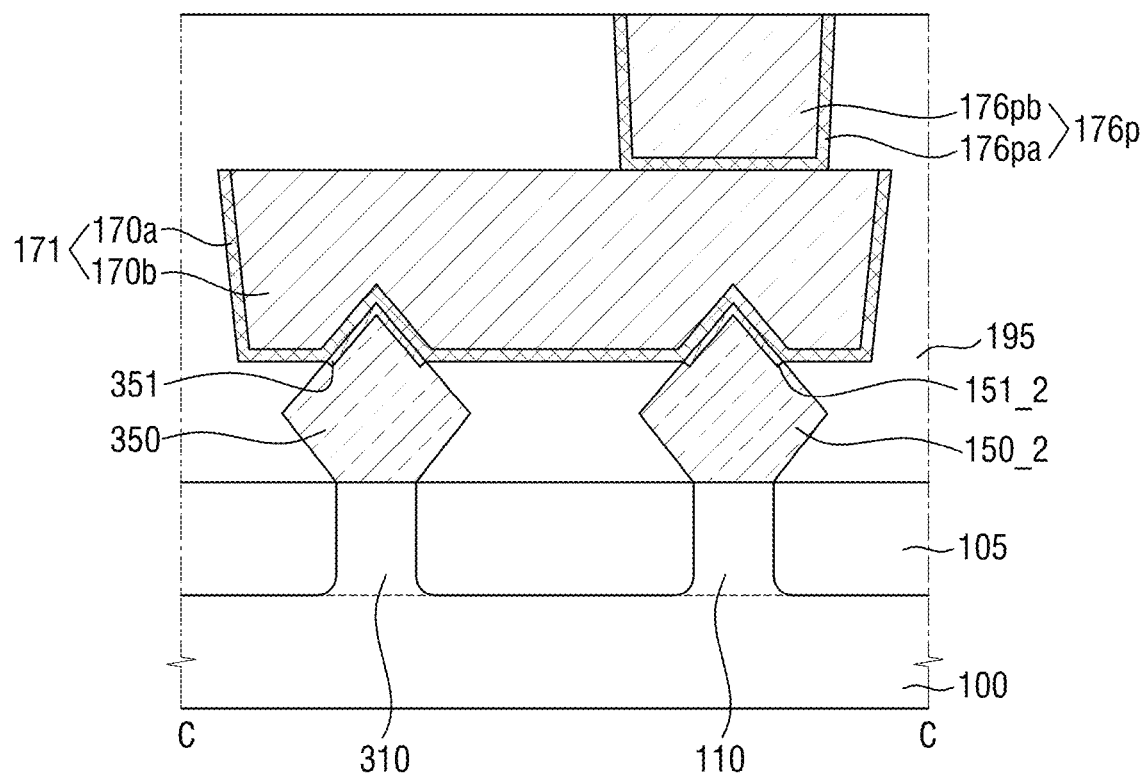

Referring to FIGS. 32 to 34, a first interlayer insulating film 195 which covers the first bridge contact 171, the third bridge contact 173, and the lower source/drain contact 180BC may be formed.

Subsequently, the first pre node contact 176p may be formed on the first bridge contact 171 and the third gate electrode 320. The second pre node contact 178p may be formed on the third bridge contact 178 and the fourth gate electrode 420. Also, the first gate contact 191 may be formed on the second gate electrode 220.

The first gate contact 191 may be formed, while the first pre node contact 176p and the second pre node contact 178p are being formed. The first gate contact 191 may be formed at the same time as the first pre node contact 176p and the second pre node contact 178p.

The upper surface of the first pre node contact 176p and the upper surface of the second pre node contact 178p may be placed on the same level, e.g. the same plane as (e.g. coplanar) the upper surface of the first gate capping pattern 145.

Figure 35:
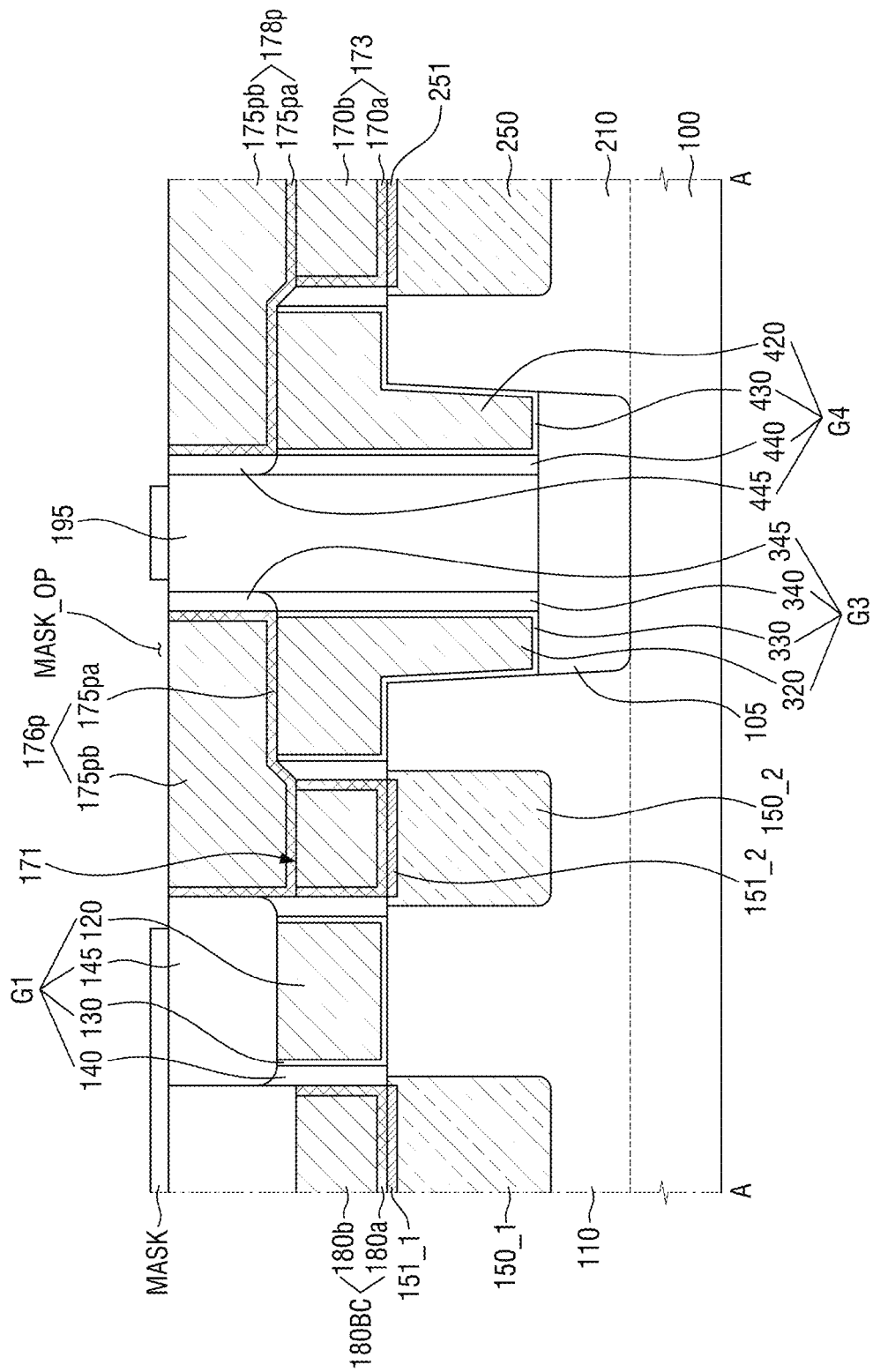
Figure 36:
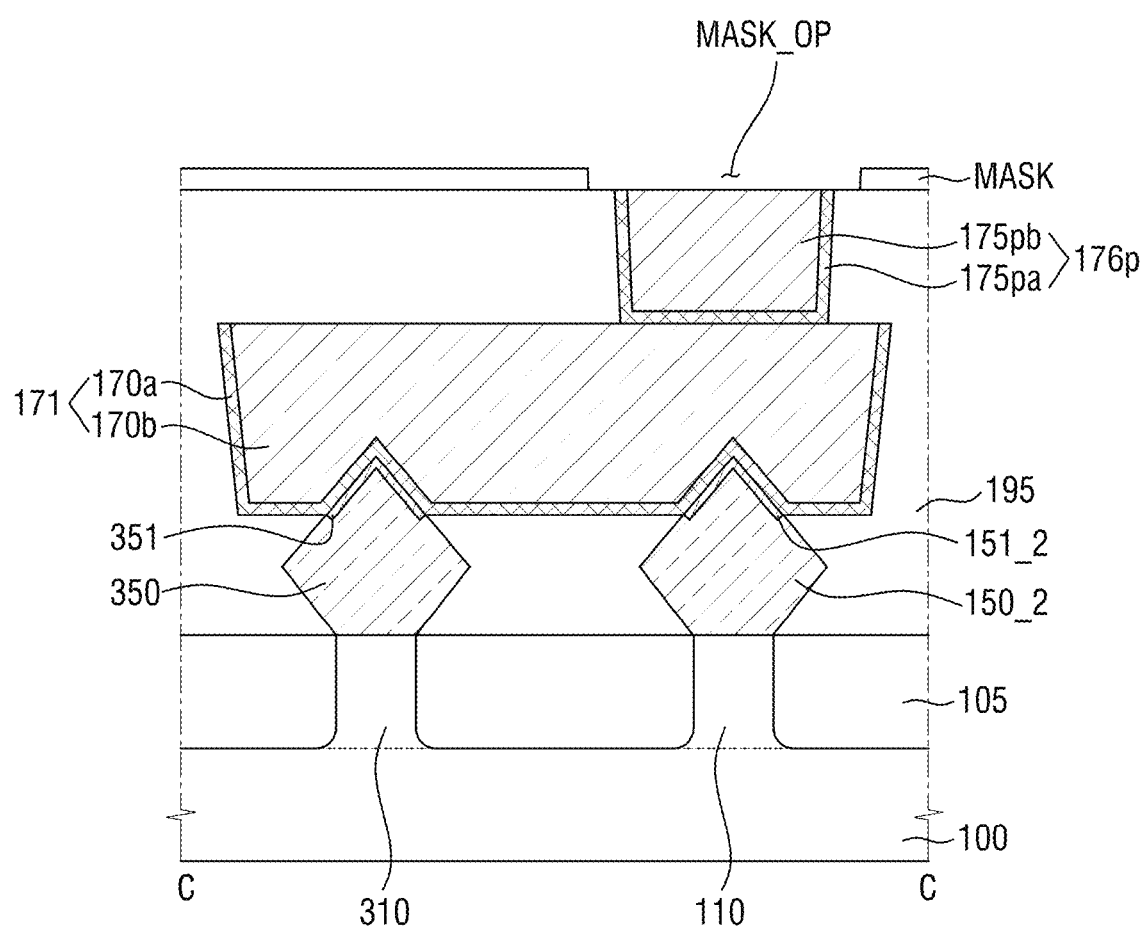

Referring to FIGS. 35 and 36, a mask pattern MASK including a mask opening MASK_OP may be formed on the first pre node contact 176p and the second pre node contact 178p.

The mask opening MASK_OP may entirely expose the upper surface of the first pre node contact 176p and the upper surface of the second pre node contact 178p.

A width of the mask opening MASK_OP in the first direction D1 may be greater than a width of the upper surface of the first pre node contact 176p in the first direction D1 and a width of the upper surface of the second pre node contact 178p in the first direction D1. A width of the mask opening MASK_OP in the second direction D2 may be greater than a width of the upper surface of the first pre node contact 176p in the second direction D2 and a width of the upper surface of the second pre node contact 178p in the second direction D2.

Figure 37:
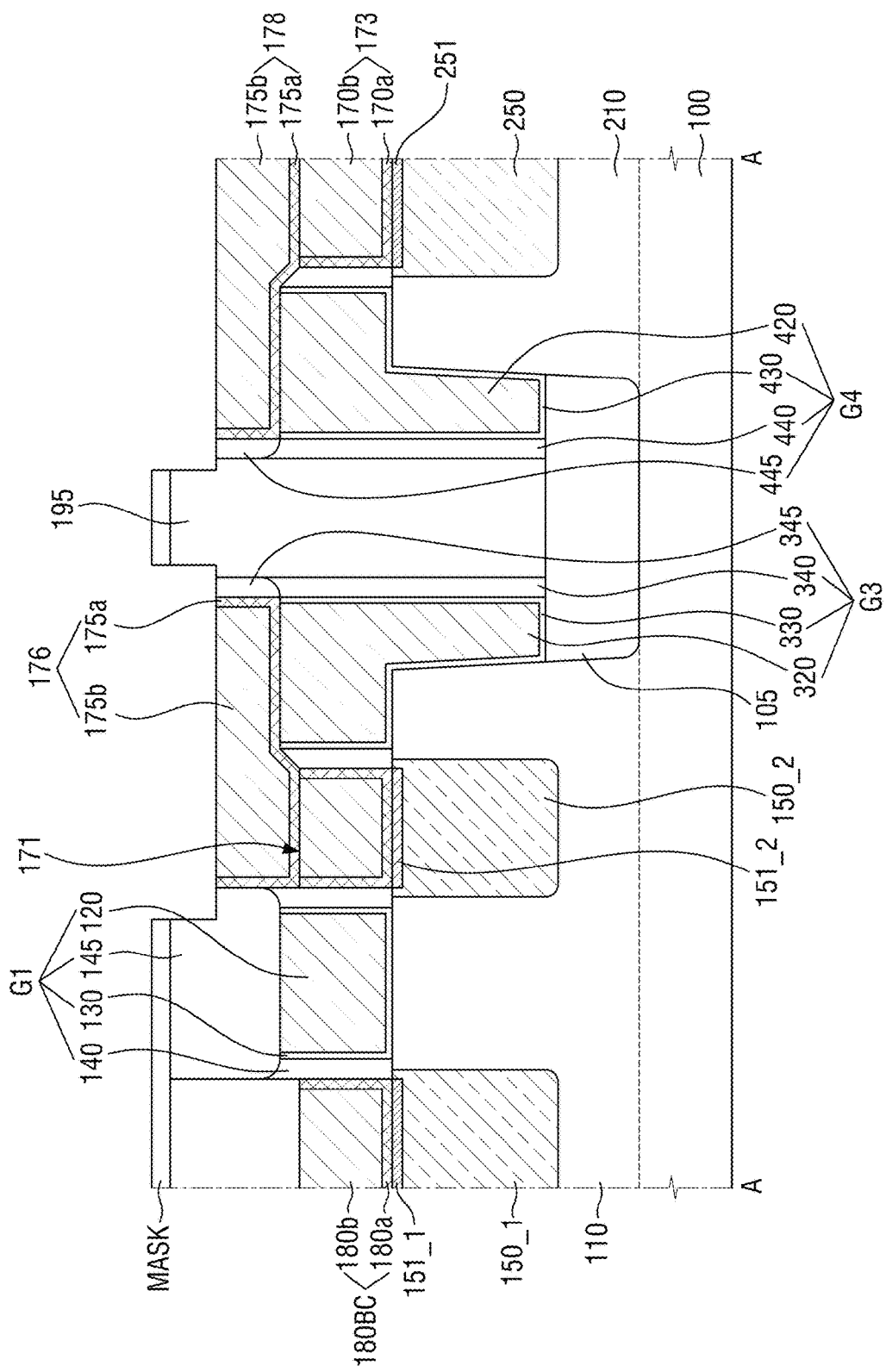
Figure 38:
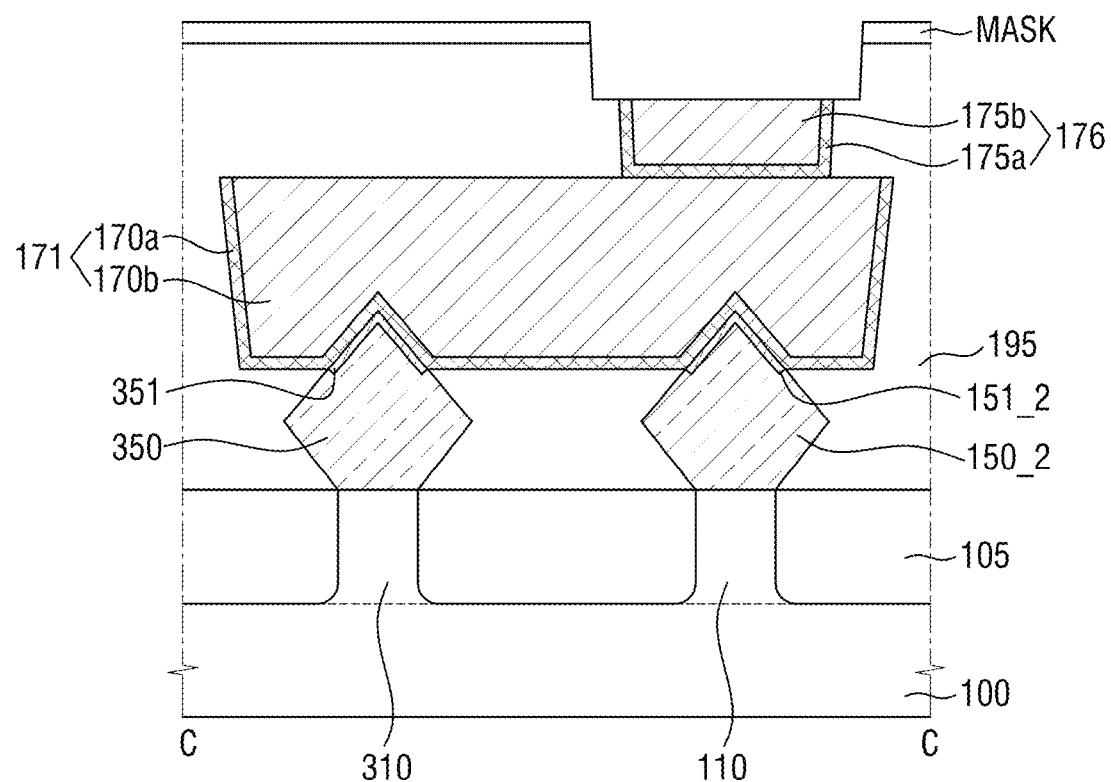

Referring to FIGS. 37 and 38, by partially removing the first pre node contact 176p and the second pre node contact 178p using the mask pattern MASK, the first node contact 176 and the third node contact 178 may be formed.

The upper surface of the first node contact 176 and the upper surface of the third node contact 178 are lower than the upper surface of the first gate capping pattern 145.

While the first node contact 176 and the third node contact 178 are being formed, a part of the first gate capping pattern 145 and a part of the first interlayer insulating film 195 may also be removed.

Figure 39:
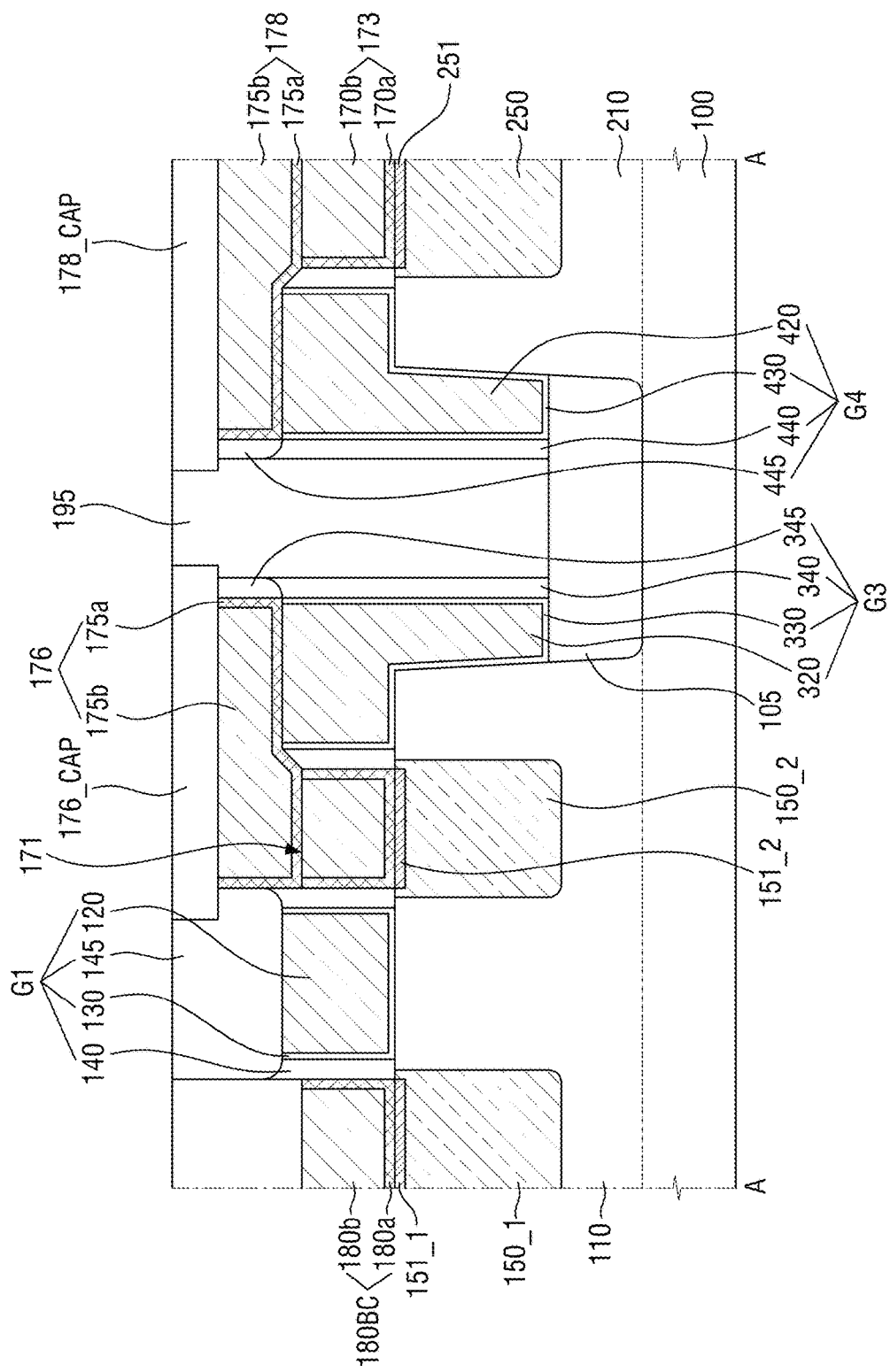
Figure 40:
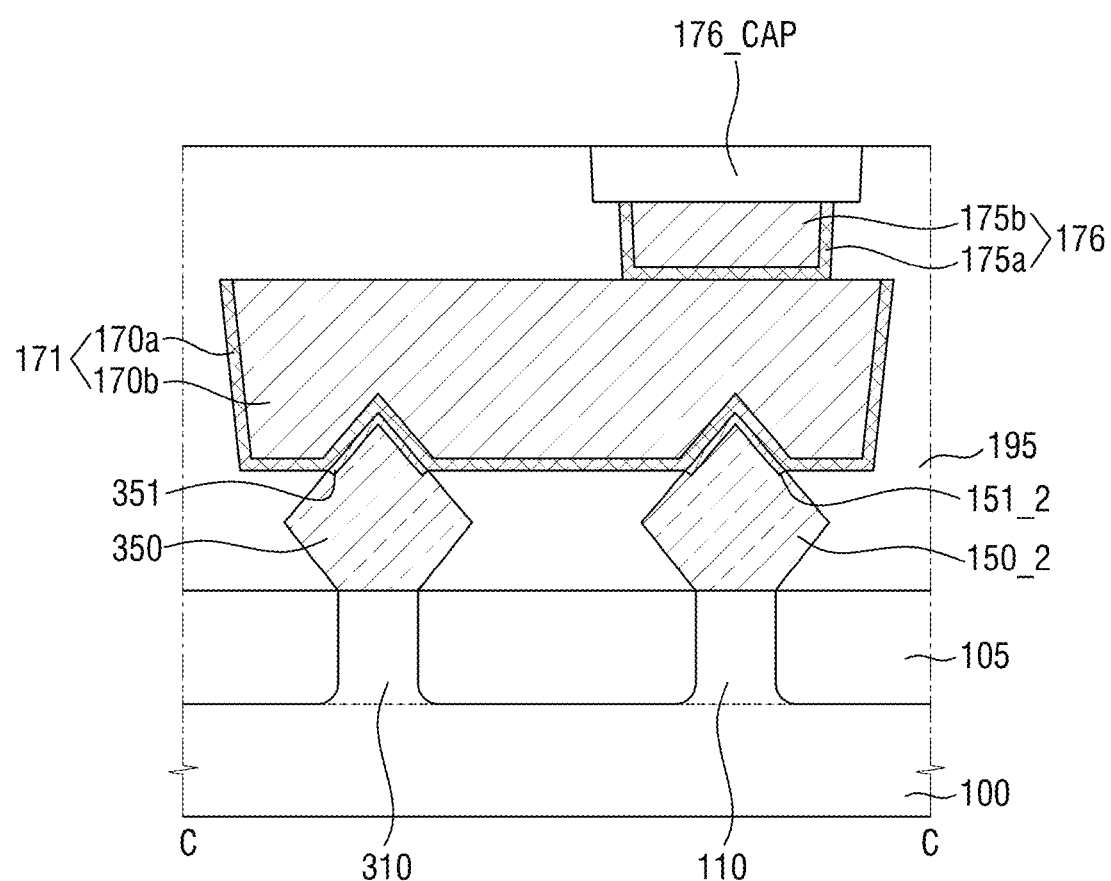

Referring to FIGS. 39 and 40, the first node capping pattern 176_CAP and the third node capping pattern 178_CAP may be formed on the first node contact 176 and the third node contact 178.

The mask pattern MASK may be removed, while the first node capping pattern 176_CAP and the third node capping pattern 178_CAP are being formed.

Unlike those explained above, in FIGS. 35 and 36, the mask opening MASK_OP may expose the upper surface of the first pre node contact 176p and the upper surface of the second pre node contact 178p at the same time. In such a case, the first node capping pattern 176_CAP may cover the first node contact 176 and the third node contact 178 together.

In concluding the detailed description, those of ordinary skill in the art will appreciate that many variations and modifications may be made to some example embodiments without substantially departing from the principles of the present disclosure. Therefore, some disclosed example embodiments of the disclosure are used in a generic and descriptive sense only and not for purposes of limitation.

What is claimed is:

1. A semiconductor device comprising:
a first gate structure extending in a first direction and including a first gate electrode and a first gate capping pattern;
a second gate structure spaced apart from the first gate structure in the first direction, extending in the first direction, and including a second gate electrode and a second gate capping pattern;
an active pattern extending in a second direction different from the first direction, the active pattern below the second gate structure;

an epitaxial pattern on one side of the second gate structure and on the active pattern;
a gate contact connected to the first gate electrode; and
a node contact electrically connected to the second gate electrode and to the epitaxial pattern,
wherein an upper surface of the gate contact is at a same level as an upper surface of the first gate capping pattern, and
an upper surface of the node contact is lower than the upper surface of the first gate capping pattern.

2. The semiconductor device of claim 1, further comprising:
a node capping pattern on the node contact,
an upper surface of the node capping pattern at the same level as the upper surface of the gate contact.

3. The semiconductor device of claim 2, wherein a width of the node capping pattern is the same as a width of the node contact.

4. The semiconductor device of claim 2, wherein a width of the node capping pattern is greater than a width of the node contact.

5. The semiconductor device of claim 1, further comprising:
a wiring pattern extending in the second direction,
a bottom surface of the wiring pattern contacting the second gate capping pattern.

6. The semiconductor device of claim 1, further comprising:
a source/drain contact between the epitaxial pattern and the node contact,
an upper surface of the source/drain contact lower than an upper surface of the second gate electrode.

7. The semiconductor device of claim 1, further comprising:
a source/drain contact between the epitaxial pattern and the node contact,
an upper surface of the source/drain contact higher than an upper surface of the second gate electrode.

8. The semiconductor device of claim 1, further comprising:
a gate separation pattern between the first gate structure and the second gate structure,
an upper surface of the gate separation pattern on the same level as the upper surface of the first gate capping pattern.

9. The semiconductor device of claim 1, wherein the active pattern includes a fin type pattern.

10. The semiconductor device of claim 1, wherein the active pattern includes a nanosheet.

11. A semiconductor device comprising:
an active pattern;
a first gate structure on the active pattern and including a first gate electrode and a first gate capping pattern;
a second gate structure on the active pattern, spaced apart from the first gate structure, and including a second gate electrode and a second gate capping pattern;
a first epitaxial pattern on the active pattern between the first gate structure and the second gate structure;
a second epitaxial pattern on the active pattern and spaced apart from the first epitaxial pattern;
a first source/drain contact on the first epitaxial pattern;
a second source/drain contact on the second epitaxial pattern; and
a node contact connecting the first source/drain contact and the second gate electrode, the node contact on the first source/drain contact and the second gate electrode,
wherein the first gate electrode is between the first epitaxial pattern and the second epitaxial pattern,
an upper surface of the second source/drain contact is on a same level as an upper surface of the first gate capping pattern, and
an upper surface of the node contact is lower than the upper surface of the first gate capping pattern.

12. The semiconductor device of claim 11, further comprising:
a node capping pattern on the node contact,
wherein a width of the node capping pattern is the same as a width of the node contact.

13. The semiconductor device of claim 11, further comprising:
a node capping pattern on the node contact,
wherein a width of the node capping pattern is greater than a width of the node contact.

14. The semiconductor device of claim 11, wherein the second source/drain contact has an integral structure.

15. The semiconductor device of claim 11, wherein the second source/drain contact includes:
a second lower source/drain contact; and
a second upper source/drain contact on the second lower source/drain contact,
wherein an upper surface of the second upper source/drain contact is on the same level as the upper surface of the first gate capping pattern.

16. The semiconductor device of claim 11, wherein the active pattern extends in a first direction, and
a width by which the second gate structure overlaps the active pattern in the first direction is less than a width of the second gate structure in the first direction.

17. The semiconductor device of claim 11, further comprising:
a wiring pattern on the second source/drain contact, the wiring pattern extending in one direction,
wherein the wiring pattern is directly connected to the second source/drain contact.

18. A semiconductor device comprising:
a first active pattern and a second active pattern, the first active pattern and the second active pattern each extending in a first direction and spaced apart from each other in a second direction;
a first gate structure extending in the second direction, the first gate structure on the first active pattern and the second active pattern, the first gate structure including a first gate electrode and a first gate capping pattern;
a second gate structure extending in the second direction, the second gate structure on the first active pattern, the second gate structure including a second gate electrode and a second gate capping pattern;
a third gate structure extending in the second direction, the third gate structure on the second active pattern, the third gate structure arranged with the second gate structure along the second direction, the third gate structure including a third gate electrode and a third gate capping pattern;
a gate contact connected to the second gate electrode, an upper surface of the gate contact is at a same level as an upper surface of the second gate capping pattern;
a first source/drain contact placed between the first gate electrode and the second gate electrode, and between the first gate electrode and the third gate electrode;
a node contact which connects the first source/drain contact and the third gate electrode on the first source/ drain contact, an upper surface of the node contact being lower than an upper surface of the third gate capping pattern;

a second source/drain contact which is spaced apart from the first source/drain contact in the first direction and placed on the second active pattern, an upper surface of the second source/drain contact being placed on the same level as an upper surface of the gate contact; and a wiring pattern directly connected to the second source/drain contact, on the second source/drain contact.

19. The semiconductor device of claim 18, further comprising:

a node capping pattern on the node contact, wherein an upper surface of the node capping pattern is on the same level as the upper surface of the gate contact.

20. The semiconductor device of claim 18, wherein each of the first active pattern and the second active pattern includes nanosheet.

* * * * *